(12) United States Patent
Awano

(10) Patent No.: US 8,076,731 B2
(45) Date of Patent: Dec. 13, 2011

(54) SEMICONDUCTOR DEVICE INCLUDING A HALO LAYER AND METHOD OF FABRICATING THE SAME

(75) Inventor: Misa Awano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 12/480,062

(22) Filed: Jun. 8, 2009

(65) Prior Publication Data
US 2009/0321851 A1    Dec. 31, 2009

(30) Foreign Application Priority Data
Jun. 30, 2008   (JP) .................. 2008-170890

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/369; 257/382; 257/E27.06; 257/E27.062

(58) Field of Classification Search .................. 257/368, 257/369, 382, 408, E27.06, E27.062
See application file for complete search history.

(56) References Cited

U.S. PATENT DOCUMENTS

| | | | |
|---|---|---|---|
| 6,274,894 B1 | 8/2001 | Wieczorek et al. | |
| 6,743,684 B2 | 6/2004 | Liu | |
| 2004/0166611 A1 | 8/2004 | Liu | |
| 2006/0038243 A1 | 2/2006 | Ueno et al. | |
| 2009/0215240 A1* | 8/2009 | Kim et al. ............. | 438/300 |

FOREIGN PATENT DOCUMENTS
JP   2006-060188   3/2006

* cited by examiner

*Primary Examiner* — Hoai V Pham
(74) *Attorney, Agent, or Firm* — Turocy & Watson, LLP

(57) ABSTRACT

A semiconductor device 1 according to one embodiment of the invention includes: a semiconductor substrate 10; a convex region 12 provided on the semiconductor substrate 10; a gate insulating film 100 provided on the convex region 12; a channel region 101 located in the convex region 12 under the gate insulating film 100; source/drain regions 115 provided on both sides of the convex region 12 and having extensions 115a on both sides of the channel region 101; and a halo layer 110 provided between the convex region 12 and the source/drain region 115 so as to contact with the convex region 12.

5 Claims, 23 Drawing Sheets

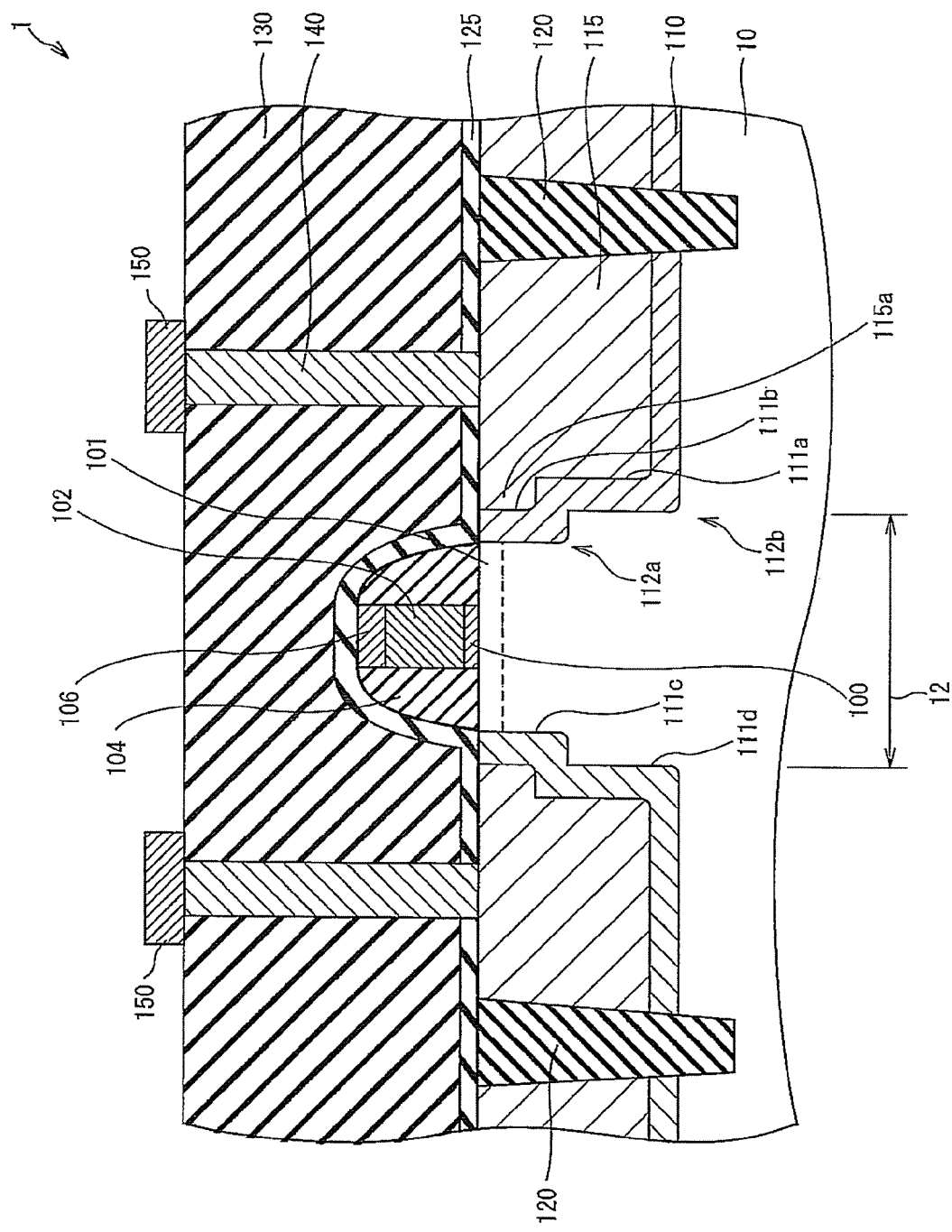

SEMICONDUCTOR DEVICE INCLUDING A HALO LAYER AND METHOD OF FABRICATING THE SAME

CROSS-REFERENCE TO RELATED APPLICATIONS

This application is based upon and claims the benefit of priority from prior Japanese Patent Application No. 2008-170890, filed on Jun. 30, 2008, the entire contents of which are incorporated herein by reference.

BACKGROUND

A conventional semiconductor device is known in which, after forming an auxiliary halo region by implanting an impurity ion into both sides of a gate pattern, a halo region is formed by forming a spacer on a sidewall of the gate pattern and applying an etching process to a portion of the auxiliary halo region. This semiconductor device is disclosed in JP-A 2006-60188.

BRIEF SUMMARY

One embodiment of the present invention provides a semiconductor device, comprising:
 a semiconductor substrate;
 a convex region provided in the semiconductor substrate;
 a gate insulating film provided on the convex region;
 a channel region located in the convex region under the gate insulating film;
 source/drain regions provided on both sides of the convex region and having extensions on both sides of the channel region; and
 a halo layer provided between the convex region and the source/drain region so as to contact with the convex region.

In addition, another embodiment of the present invention provides a method of fabricating a semiconductor device, comprising:
 forming a gate electrode on a semiconductor substrate via a gate insulating film;
 forming a gate sidewall on a side face of the gate electrode;
 etching the semiconductor substrate using the gate electrode having the gate sidewall formed thereon as a mask;
 epitaxially growing a halo layer on the semiconductor substrate, the semiconductor substrate being etched in the process of etching the semiconductor substrate; and
 epitaxially growing a source/drain region on the halo layer.

BRIEF DESCRIPTION OF THE DRAWINGS

FIG. 1 is a partial cross sectional view showing a semiconductor device according to a first embodiment;

DETAILED DESCRIPTION

First Embodiment

Figure 2A:
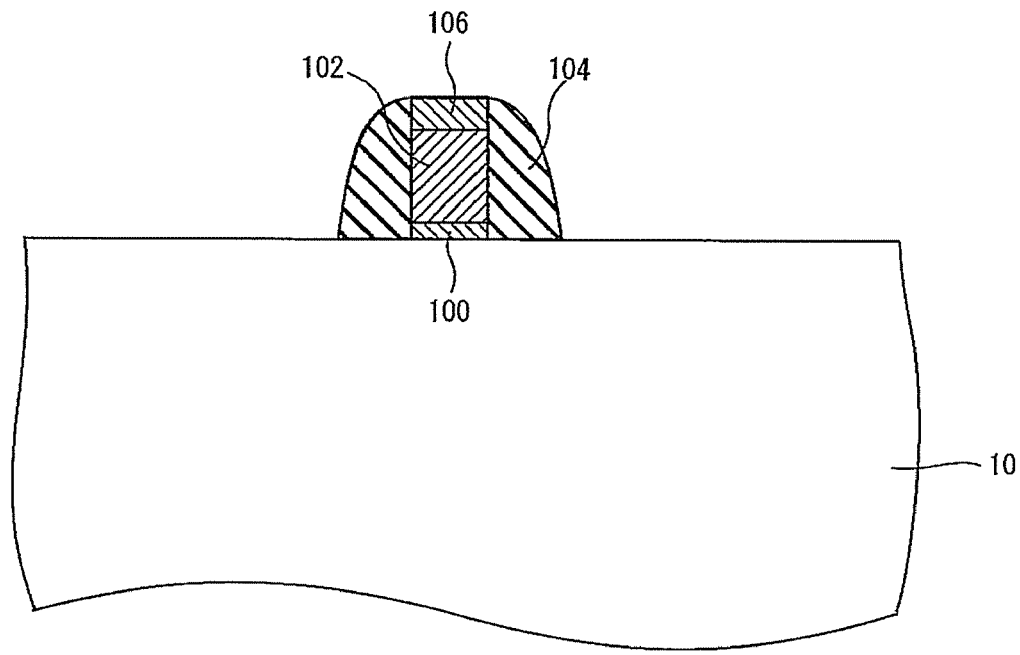
FIG. 2A is a partial cross sectional view showing a process for fabricating the semiconductor device according to the first embodiment.

FIG. 1 is a partial cross section schematically showing a semiconductor device according to a first embodiment.

A semiconductor device 1 according to the first embodiment includes a semiconductor substrate 10 which has a convex region 12 having a predetermined height in a predetermined region thereof, a halo layer 110 provided in contact with a surface of the semiconductor substrate 10 (i.e., the surface of the semiconductor substrate 10 other than a region in which the convex region 12 is provided) and a side face of the convex region 12, and a source/drain region 115 in contact with a surface of the halo layer 110 opposite to the side in contact with the semiconductor substrate 10 and the convex region 12 and having an extension 115a.

In addition, the semiconductor device 1 includes a gate electrode 102 provided on an upper surface of the convex region 12 via a gate insulating film 100, a cap layer 106 provided on a surface of the gate electrode 102 opposite to the side in contact with the gate insulating film 100, and a gate sidewall 104 provided in contact with each side face of the gate electrode 102 and the cap layer 106.

Furthermore, the semiconductor device 1 includes a liner film 125 provided in contact with each surface of the source/drain region 115, the gate sidewall 104 and the cap layer 106, and an interlayer insulating film 130 provided on the liner film 125 opposite to the surface thereof in contact with the source/drain region 115, the gate sidewall 104 and the cap layer 106. In addition, the semiconductor device 1 includes a contact plug 140 provided so as to penetrate predetermined regions of the interlayer insulating film 130 and the liner film 125 and electrically connected to the source/drain region 115 at a lower end thereof, and a contact 150 electrically connected to an upper end of the contact plug 140. Furthermore, the semiconductor device 1 includes an element isolation region 120 for isolating an element region in which a semiconductor device is provided.

The semiconductor device 1 according to the present embodiment is, e.g., a transistor (e.g., Metal Oxide Semiconductor Field Effect Transistor: MOSFET). Concretely, the semiconductor device 1 according to the present embodiment is an example of a transistor with a fine structure for 32 nm node and beyond.

The semiconductor substrate 10 is made of a semiconductor material of a predetermined conductivity type, and has a predetermined thickness. The semiconductor substrate 10 is made of, e.g., silicon (Si). Alternatively, the semiconductor substrate 10 may be made of silicon germanium (SiGe) or Silicon On Insulator (SOI) substrate, etc. The element isolation region 120 is formed having, e.g., a Shallow Trench Isolation (STI) structure, and is made of an insulating material such as silicon dioxide ($SiO_2$), etc.

The convex region 12 has different widths in a portion sandwiched by the extensions 115a via the halo layer 110 (hereinafter, referred to as a portion corresponding to the extension 115a) and in a portion other than the portion corresponding to the extensions 115a, i.e., a portion other than the portion corresponding to the extension 115a as well as sandwiched by the source/drain regions 115 via the halo layer 110 (hereinafter, referred to as a portion corresponding to the source/drain region 115). In other words, the convex region 12 according to the first embodiment is formed having a level difference with a predetermined height. Concretely, the convex region 12 according to the first embodiment is formed so that the width of the portion corresponding to the extension 115a is narrower than that in the portion corresponding to the source/drain region 115. In addition, the convex region 12 includes a channel region 101 in the portion corresponding to the extension 115a.

The halo layer 110 is provided in a region between the convex region 12 and the source/drain region 115, which includes at least a portion corresponding to a leak path. Concretely, the halo layer 110 is provided in a region corresponding to at least portions 112a and 112b which have a convex shape from the side face of the convex region 12 toward the inside of the convex region 12 in a cross section of the convex region 12. In addition, the halo layer 110 has boundaries at each of a portion in contact with the surface of the semiconductor substrate 10, a portion in contact with the side face of the convex region 12, a portion in contact with the extension 115a and a portion in contact with the source/drain region 115.

Concretely, the halo layer 110 has a boundary 111a formed in contact with the source/drain region 115 and a boundary 111b formed in contact with the extension 115a. In addition, the halo layer 110 has a boundary 111c formed in contact with the side face of the convex region 12 in the portion corresponding to the extension 115a, and has a boundary 111d formed in contact with the side face of the convex region 12 in the portion corresponding to the source/drain region 115.

In addition, the halo layer 110 is made of a semiconductor material, such as Si, etc., having a predetermined conductivity type and containing an impurity at a predetermined concentration. Here, the concentration of the impurity contained in the halo layer 110 is, e.g., a concentration to exert a function of the halo layer 110 for suppressing a punch-through current between the source/drain regions 115, which is a concentration determined in accordance with a thickness of the halo layer 110. For example, the halo layer 110 contains an impurity at a concentration of $10^{18}$ cm$^{-3}$ order. When the semiconductor device 1 is a MOSFET as an n-type semiconductor device which is a first conductivity type, a p-type impurity such as boron (B) or indium (In), etc., is used for the impurity contained in the halo layer 110 in order that the halo layer 110 becomes p-type as a second conductivity type. On the other hand, when the semiconductor device 1 is a MOSFET as a p-type semiconductor device, an n-type impurity such as arsenic (As) or phosphorus (P), etc., is used in order that the halo layer 110 becomes n-type.

In the first embodiment, the halo layer 110 has respective boundaries at each of portions in contact with the semiconductor substrate 10, the convex region 12 and the source/drain region 115 having the extension 115a. In addition, due to the existence of these boundaries, the concentration of the impurity contained in the halo layer 110 is steeply changed at respective interfaces between the semiconductor substrate 10 and the halo layer 110 (interface A), between the convex region 12 and the halo layer 110 (interface B), and between the halo layer 110 and the source/drain region 115 including the extension 115a (interface C). In other words, the concentration of the impurity contained in the halo layer 110 is rapidly decreased outside of the halo layer 110 across the interfaces A, B and C. A region of the halo layer 110 in which the impurity is present is substantially limited inside the halo layer 110 by these boundaries.

The source/drain regions 115 are provided on both sides of the convex region 12 via the halo layer 110. In addition, the source/drain regions 115 are provided having the extensions 115a in regions located on both sides of the channel region 101. Furthermore, the source/drain region 115 is made of a semiconductor material containing an impurity of a predetermined conductivity type at a predetermined concentration. For example, the source/drain region 115 is made of a semiconductor material such as Si or SiGe, etc. When the semiconductor device 1 is an n-type MOSFET, the source/drain region 115 contains an n-type impurity such as As or P, etc. Meanwhile, when the semiconductor device 1 is a p-type MOSFET, the source/drain region 115 contains a p-type impurity such as B or In, etc. In the first embodiment, the impurity concentration of the source/drain region 115 can be substantially identical to that of the extension 115a.

The liner film 125 is made of, e.g., an insulating material such as silicon nitride (SiN) or $SiO_2$, etc. Meanwhile, the gate insulating film 100 is made of, e.g., an insulating material such as $SiO_2$, SiN, SiON, or a high-dielectric material (e.g., an Hf-based material such as HfSiON, HfSiO or HfO, etc., a Zr-based material such as ZrSiON, ZrSiO or ZrO, etc., and a Y-based material such as $Y_2O_3$, etc.). The gate sidewall 104 is made of, e.g., an insulating material such as SiN, etc.

The gate electrode 102 is formed having a predetermined width and is made of polycrystalline silicon (polysilicon) or polycrystalline silicon germanium containing an impurity of a predetermined conductivity type. For example, when the semiconductor device 1 is an n-type MOSFET, the gate electrode 102 contains an n-type impurity such as As or P, etc. Meanwhile, when the semiconductor device 1 is a p-type MOSFET, a p-type impurity such as B or boron difluoride ($BF_2$), etc., is contained therein. Alternatively, the gate electrode 102 may be formed of a metal gate electrode made of a metal material such as tungsten (W), tantalum (Ta), titanium (Ti), hafnium (Hf), zirconium (Zr), ruthenium (Ru), platinum (Pt), iridium (Ir), molybdenum (Mo) or aluminum (Al), etc., or a compound thereof. Furthermore, the cap layer 106 may be made of, e.g., an insulating material such as SiN, etc., having a predetermined thickness.

The interlayer insulating film 130 is made of an insulating material that allows selective etching of the liner film 125. The interlayer insulating film 130 is made of, e.g., $SiO_2$ when the liner film 125 is made of, e.g., SiN. The interlayer insulating film 130 can be made of silicon oxide such as SiOC which is carbon (C) doped $SiO_2$, SiON which is nitrogen (N) doped $SiO_2$, SiOF which is fluorine (F) doped $SiO_2$ and BPSG which is B- and P-doped $SiO_2$, etc., or an organic insulating material such as SiOCH, polymethylsiloxane, polyarylene and benzoxazole, etc.

The contact plug 140 is made of a conductive material, and is formed containing a metal material as a plug material, such as copper (Cu), Al, gold (Au), silver (Ag), W, Mo, zinc (Zn), cobalt (Co), nickel (Ni), rhodium (Rh) and iron (Fe), etc. Meanwhile, the contact 150 is made of a conductive material and formed having a predetermined pattern. The contact 150 is each formed containing a metal material such as, e.g., Cu, Al, Au, Ag or W, etc.

In the present embodiment, the convex region 12 is configured to have a surface substantially perpendicular to the surface of the semiconductor substrate 10 and a surface substantially parallel to the surface of the semiconductor substrate 10, however, the shape of the convex region 12 is not limited to the present embodiment as long as a boundary between the halo layer 110 and the convex region 12 formed by the contact of the halo layer 110 with the convex region 12 exists. For example, the convex region 12 can be formed having an inclined surface inclining at a predetermined angle with respect to the surface of the semiconductor substrate 10. Alternatively, the convex region 12 can be formed having a curved surface.

FIGS. 2A to 6 are partial cross sections schematically showing the processes for fabricating the semiconductor device according to the first embodiment.

Firstly, element isolation regions 120 (not shown) for each isolating regions, in which plural semiconductor devices 1 are formed, are formed in the semiconductor substrate 10 made of silicon. Following this, the gate electrode 102 made of polysilicon is formed on a predetermined region of the semiconductor substrate 10 via the gate insulating film 100 made of $SiO_2$. Then, the gate sidewalls 104 having a function as an offset spacer for defining a region of the extension 115a are formed on both side walls of the gate insulating film 100 and the gate electrode 102. The gate insulating film 100, the gate electrode 102 and the gate sidewall 104 are formed using a deposition method such as a Chemical Vapor Deposition (CVD) method, etc., and a photolithography method.

Next, a cap layer 106 is formed on the gate electrode 102. The cap layer 106 is formed using, e.g., the CVD method (FIG. 2A). Note that, the cap layer 106 prevents alteration of the gate electrode 102 caused by an etching process and an epitaxial growth, etc., performed in a posterior process.

Figure 2B:
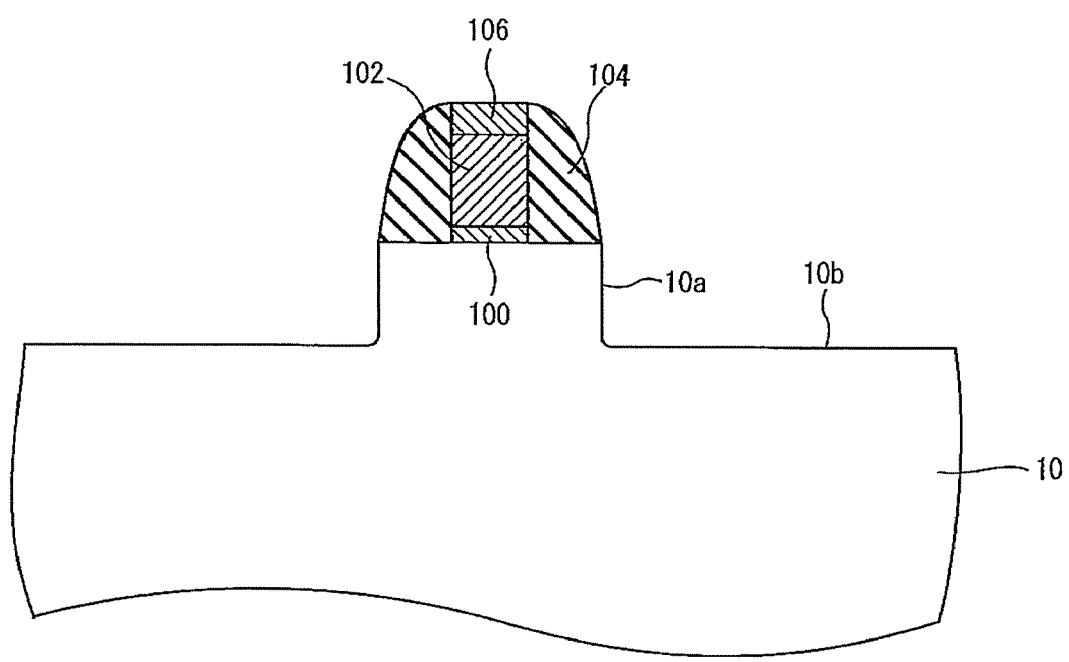
FIG. 2B is a partial cross sectional view showing a process for fabricating the semiconductor device according to the first embodiment.

Next, an etching process is applied to the semiconductor substrate 10 using the cap layer 106 and the gate sidewall 104 as a mask. For the etching process, it is possible to use, e.g., a reactive ion etching (RIE) method as a dry etching process. Thus, as shown in FIG. 2B, the semiconductor substrate 10 other than a portion immediately under the cap layer 106 and the gate sidewall 104 is etched, which results in that a surface 10b (i.e., a surface substantially parallel to an interface between the gate insulating film 100 and the semiconductor substrate 10) and a surface 10a substantially perpendicular to the surface 10b are formed on the semiconductor substrate 10.

Here, an etching depth of the semiconductor substrate 10 by the dry etching process is a depth such that a distance from an interface between the surface of the semiconductor substrate 10 and the gate insulating film 100 to the surface 10b of the semiconductor substrate 10 formed by the dry etching process is at least greater than a thickness of extension 115a provided in the semiconductor device 1 to be fabricated.

Figure 3A:
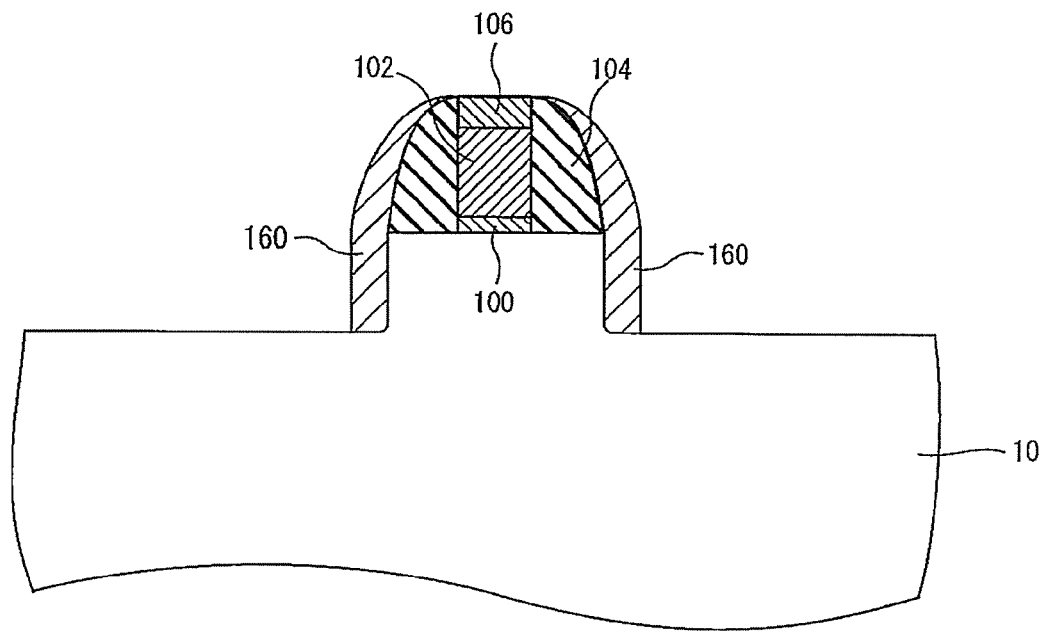
FIG. 3A is a partial cross sectional view showing a process for fabricating the semiconductor device according to the first embodiment.

Next, as shown in FIG. 3A, a spacer 160 is formed on the gate sidewall 104 and the surface 10a of the semiconductor substrate 10. For example, after forming a film of an insulating material such as SiN, etc., on the semiconductor substrate 10, the gate sidewall 104 and the cap layer 106, the dry etching process is applied to the formed layer, which results in that the spacer 160 is formed. Alternatively, the spacer 160 can be formed of photoresist.

Figure 3B:
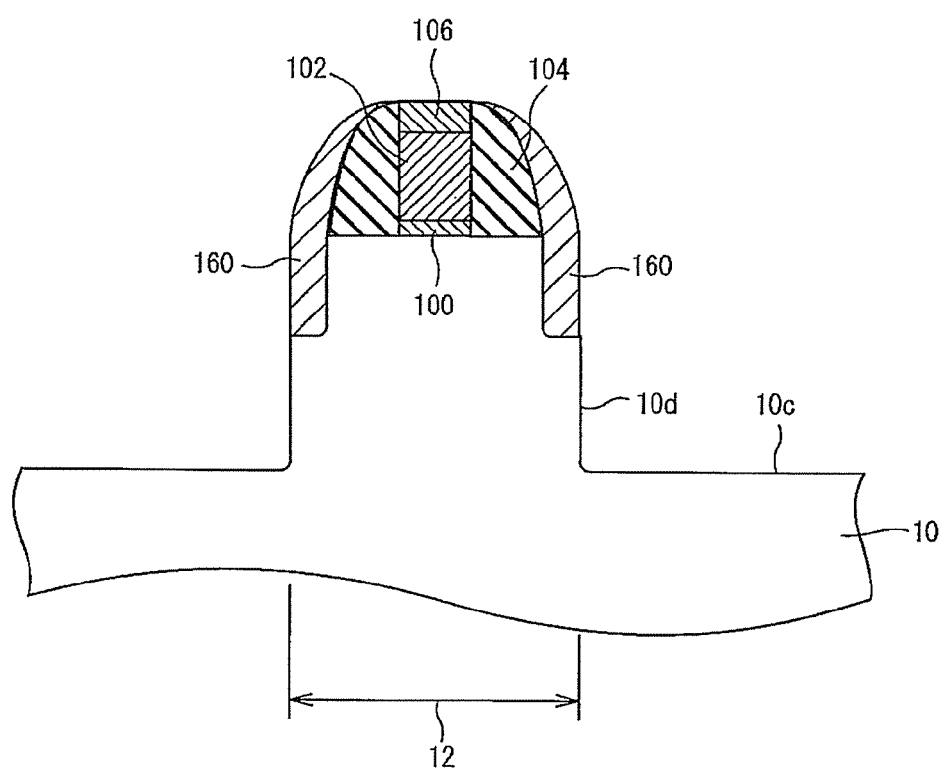
FIG. 3B is a partial cross sectional view showing a process for fabricating the semiconductor device according to the first embodiment.

Next, as shown in FIG. 3B, the dry etching process is applied to the semiconductor substrate 10 using the spacer 160 as a mask. As a result, the semiconductor substrate 10 other than a portion immediately under the spacer 160 is etched and a surface 10c (i.e., a surface substantially horizontal to an interface between the gate insulating film 100 and the semiconductor substrate 10) and a surface 10d perpendicular to the surface 10c are formed on the semiconductor substrate 10, which results in that the convex region 12 is formed. Note that, it is possible to form the convex region 12 by applying wet etching to the semiconductor substrate 10 using the spacer 160 as a mask.

Here, an etching depth of the semiconductor substrate 10 by the dry etching process in the process of FIG. 3B is a depth such that a distance from an interface between the surface of the semiconductor substrate 10 and the gate insulating film 100 to the surface 10c of the semiconductor substrate 10 formed by the dry etching process is at least greater than a thickness of source/drain region 115 provided in the semiconductor device 1 to be fabricated.

Figure 4A:
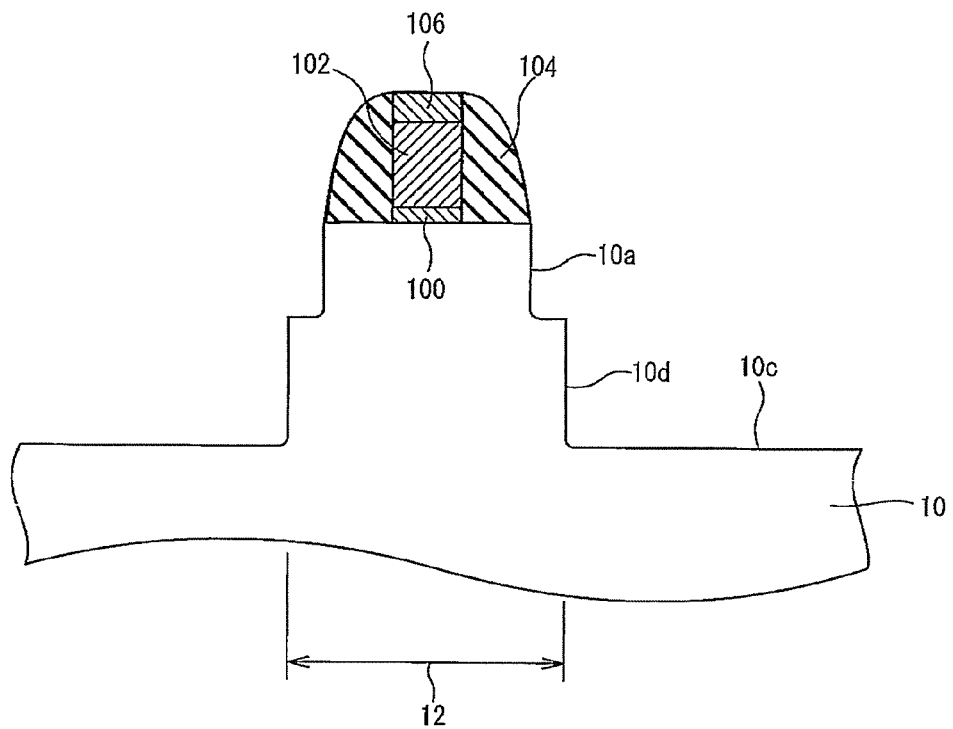
FIG. 4A is a partial cross sectional view showing a process for fabricating the semiconductor device according to the first embodiment.

Next, as shown in FIG. 4A, the spacer 160 is removed. As a result, the surfaces 10a and 10d of the convex region 12 as boundaries between the semiconductor substrate 10 and a subsequently formed halo layer 110 and between the convex region 12 and the subsequently formed halo layer 110, and the surface 10c of the semiconductor substrate 10 are formed. In other words, in the first embodiment, the boundaries between the semiconductor substrate 10 and the halo layer 110 and between the convex region 12 and the halo layer 110 are determined by applying the etching process to the semiconductor substrate 10.

Figure 4B:
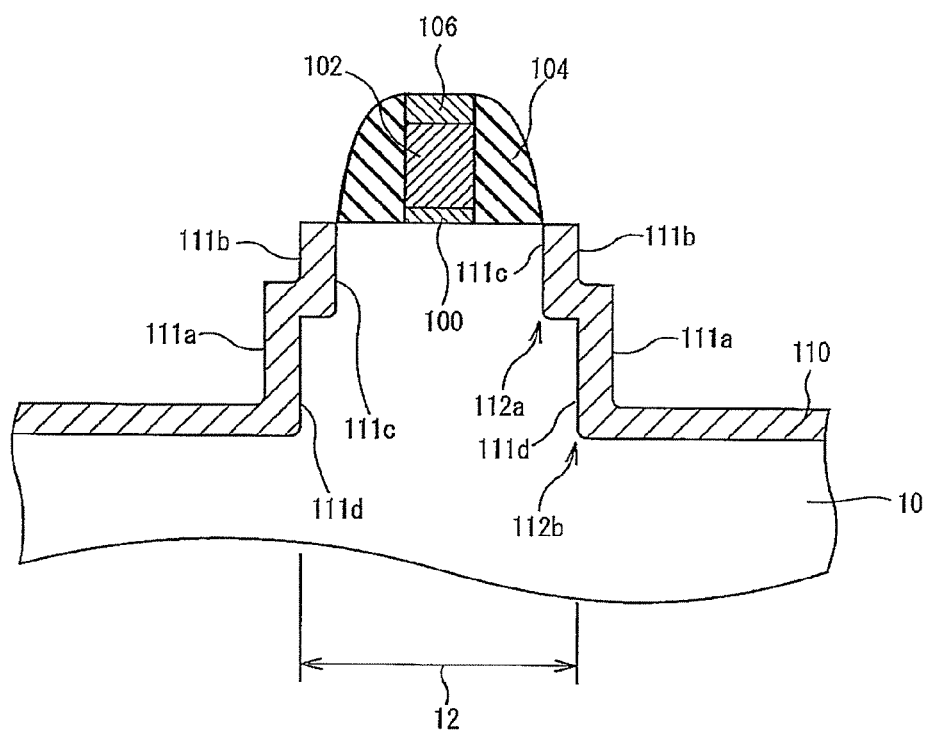
FIG. 4B is a partial cross sectional view showing a process for fabricating the semiconductor device according to the first embodiment.

Next, as shown in FIG. 4B, the halo layer 110 is epitaxially grown on the surface of the semiconductor substrate 10 and the side face of the convex region 12. The halo layer 110 is epitaxially grown along the surface of the semiconductor substrate 10 and the surface of the convex region 12. Concretely, while epitaxially growing a semiconductor layer on the semiconductor substrate 10 and the side face of the convex region 12 simultaneously using a raw material of a semiconductor material composing the halo layer 110 and a raw material of an impurity which should be contained in the halo layer 110 to be grown, the impurity is added to the epitaxially growing semiconductor layer, thereby forming the halo layer 110 on the semiconductor substrate 10 and the side face of the convex region 12. Note that, the epitaxial growth, in which crystal growth of the semiconductor layer is performed while adding a predetermined impurity during the epitaxial growth, is hereinafter referred to as in situ epitaxial growth. Then, the halo layer 110 is formed being controlled to be a predetermined film thickness by the in situ epitaxial growth.

Here, as shown in FIG. 4B, when the halo layer 110 is formed, a boundary 111c is formed in a portion where the portion of the side face of the convex region 12 corresponding to the extension 115a contacts with the halo layer 110, and a boundary 111d is formed in a portion where the portion of the side face of the convex region 12 other than the portion thereof corresponding to the extension 115a (i.e., a portion corresponding to the source/drain region 115) contacts with the halo layer 110. Furthermore, the halo layer 110 is formed in contact with at least the portions 112a and 112b, which can be a leak path of the convex region 12.

Figure 5A:
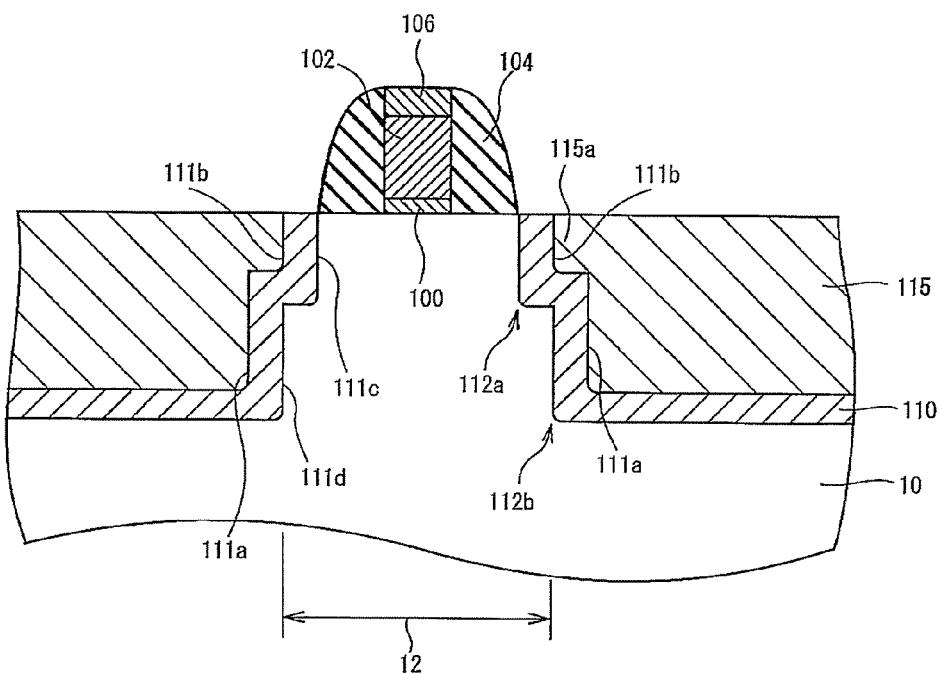
FIG. 5A is a partial cross sectional view showing a process for fabricating the semiconductor device according to the first embodiment.

Next, as shown in FIG. 5A, a predetermined semiconductor layer is epitaxially grown in situ on the halo layer 110. In the convex region 12 of the present embodiment, the width of the portion corresponding to the extension 115a is narrower than that of the portion corresponding to the source/drain region 115. Therefore, the source/drain region 115 having the extension 115a corresponding to the shape of the convex region 12 is formed by only the in situ epitaxial growth of the predetermined semiconductor layer.

The in situ epitaxial growth of the source/drain region 115 having the extension 115a is performed while adding a predetermined impurity at a predetermined concentration to a semiconductor which forms the source/drain region 115. Note that, the concentration of the impurity to be added can be changed by the in situ epitaxial growth of the source/drain region 115 depending on progress of the crystal growth from the semiconductor substrate 10 to the extension 115a.

Here, when the source/drain region 115 having the extension 115a is formed, a boundary 111b is formed in a portion where the surface of the halo layer 110 contacts with the extension 115a, and a boundary 111a is formed in a portion where the surface of the halo layer 110 contacts with the source/drain region 115. Note that, when the impurity concentration of the extension 115a and that of the source/drain region 115 are less than the concentration required for the semiconductor device 1 to be fabricated after the in situ epitaxial growth, an impurity ion of a predetermined conductivity type is implanted into the extension 115a and the source/drain region 115.

Following this, in order to each activate the impurity contained in the halo layer 110, the impurity contained in the extension 115a and the impurity contained in source/drain region 115, thermal treatment such as Spike Rapid Thermal Annealing (Spike RTA) or Milli Second Annealing (MSA), etc., is applied after forming the source/drain region 115 having the extension 115a.

Figure 5B:
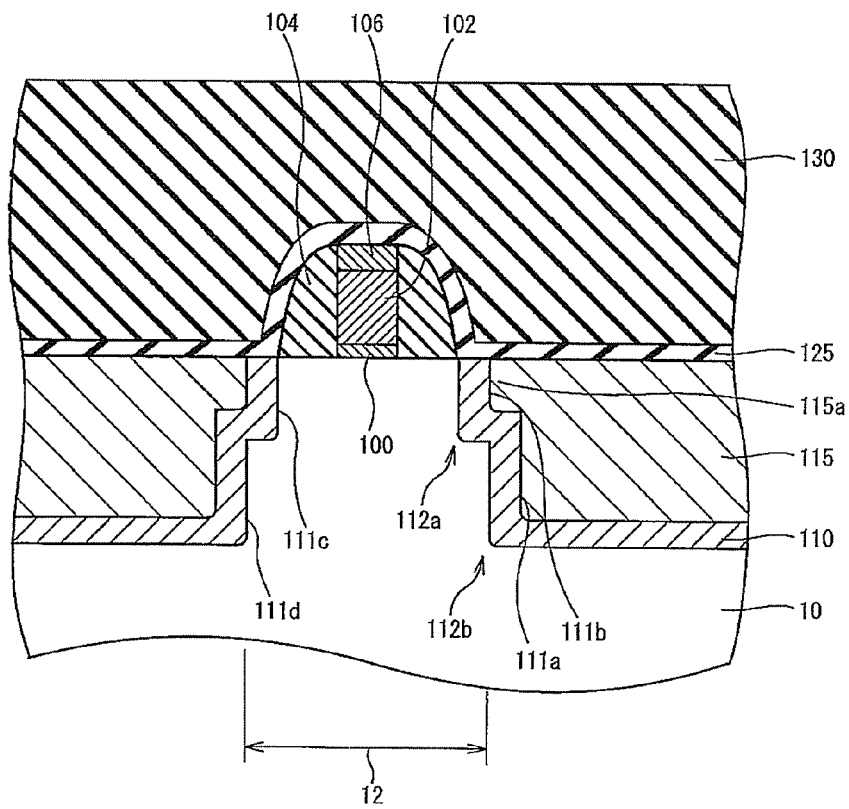
FIG. 5B is a partial cross sectional view showing a process for fabricating the semiconductor device according to the first embodiment.

Next, as shown in FIG. 5B, the liner film 125, which contacts with the surfaces of the source/drain regions 115, the gate sidewalls 104 and the cap layer 106, is formed. Subsequently, the interlayer insulating film 130 is formed on the liner film 125 by the CVD method, etc. Then, after forming a predetermined trench at predetermined portions of the interlayer insulating film 130 and the liner film 125 by using the photolithography method and the RIE method, etc., a plug material film made of a material composing the contact plug 140 is deposited on the interlayer insulating film 130 using a sputtering method, etc., while filling the plug material film into the trench formed in the interlayer insulating film 130 and the liner film 125.

Following this, planarizing treatment is applied to the plug material film by the Chemical Mechanical Polishing (CMP) method, etc., using an upper surface of the interlayer insulating film 130 as a stopper. As a result, the contact plug 140 is formed. Then, a mask pattern in which a region for forming the contact 150 is exposed is formed on the surface of the interlayer insulating film 130 by using the photolithography method and the RIE method, etc. The region for forming the contact 150 includes at least a region in which the upper end of the contact plug 140 is exposed. Following this, a material composing the contact 150 is deposited in the region for forming the contact 150 by the sputtering method, etc. The mask pattern is removed after forming the contact 150.

Figure 6:
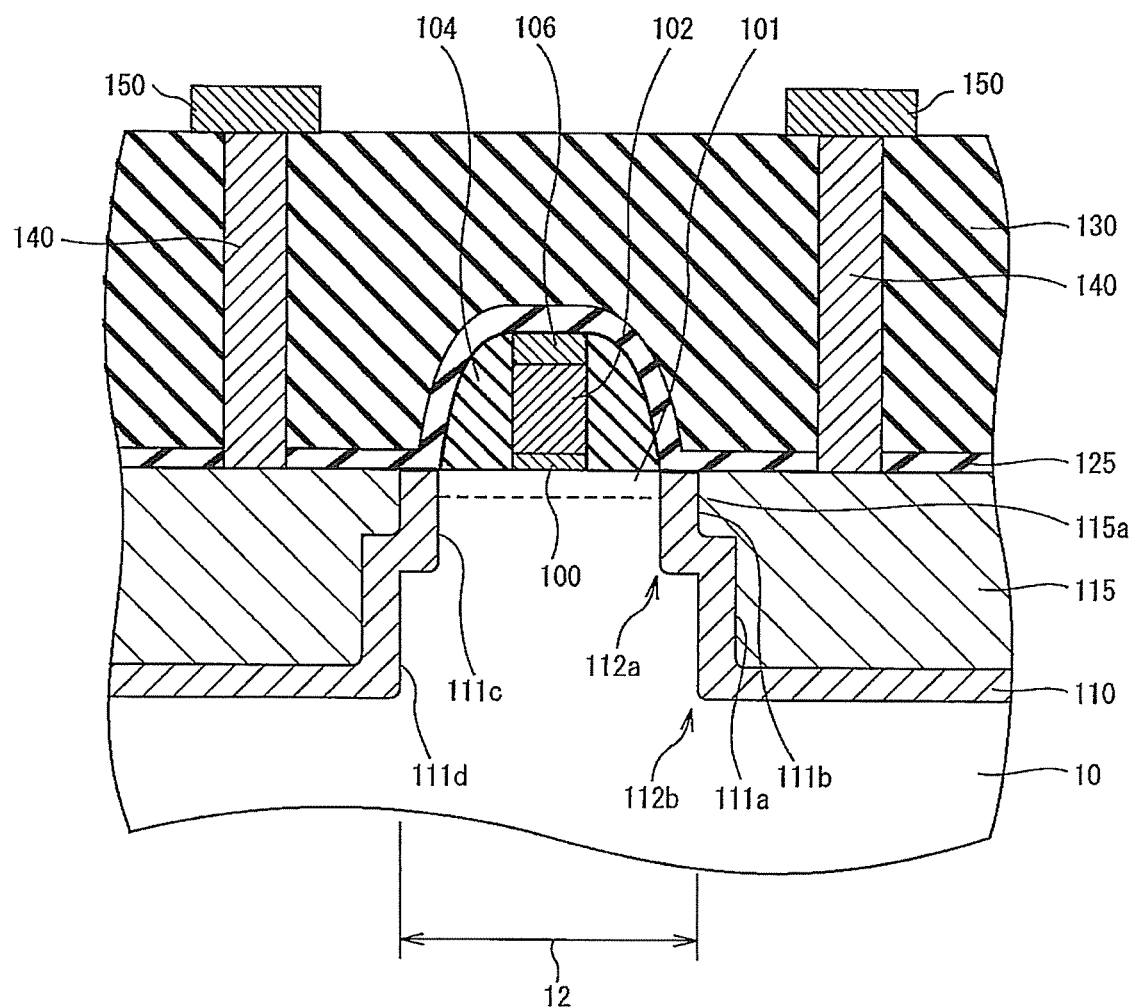
FIG. 6 is a partial cross sectional view showing a process for fabricating the semiconductor device according to the first embodiment.

The semiconductor device 1 according to the first embodiment shown in FIG. 6 is fabricated through the above processes.

In the semiconductor device 1 according to the first embodiment, since the halo layer 110 containing a predetermined impurity at a predetermined concentration is epitaxially grown on the surface of the convex region 12 which is formed in the semiconductor substrate 10 by etching, it is possible to form the halo layer 110 only in a portion where a short channel effect is required to be suppressed. Therefore, according to the semiconductor device 1 of the first embodiment, it is possible to suppress the distribution of the impurity of the halo layer 110 in the area other than the area for forming the halo layer 110.

In addition, in the semiconductor device 1 according to the first embodiment, since the halo layer 110 containing a predetermined impurity at a predetermined concentration is epitaxially grown in situ on the surface of the convex region 12 which is formed in the semiconductor substrate 10 by etching, boundaries are formed between the halo layer 110 and the convex region 12 and between the halo layer 110 and the source/drain region 115. As a result, a concentration profile of the impurity contained in the halo layer 110 becomes a profile having a slope at least steeper than the case that the halo layer 110 is formed by ion implantation. In addition, since it is possible to distribute an impurity in a region of the halo layer 110, the impurity concentration in the halo layer 110 can be high. Note that, since the implanted ion diffuses from the implanted region when a halo region is formed by the ion implantation, the halo region is formed without having a boundary and a region in which the impurity concentration of the halo region steeply changes does not exist between the halo region and the semiconductor surrounding the halo region.

Therefore, in the semiconductor device 1 according to the first embodiment, since it is possible to effectively suppress the short channel effect by the halo layer 110 as well as to suppress the diffusion of the impurity contained in the halo layer 110 into the channel region 101, it is possible to suppress decrease of mobility in the channel region 101. In other words, according to the semiconductor device 1 of the first embodiment, since it is possible to suppress the distribution of the impurity of the halo layer 110 in the area other than the area for forming the halo layer 110, the suppression of the short channel effect and the suppression of decrease of driving force associated with the suppression of the decrease of the mobility in the channel region 101 are both possible.

Furthermore, in the semiconductor device 1 according to the first embodiment, since the halo layer 110 is formed by the epitaxial growth, it is substantially possible to ignore a crystal damage to the semiconductor substrate 10 and the convex region 12 compared with the case that the halo region is formed by the ion implantation. Therefore, in the first embodiment, it is possible to suppress the diffusion of the impurity contained in the convex region 12 into the channel region 101 through crystal defects.

Second Embodiment

Figure 7:
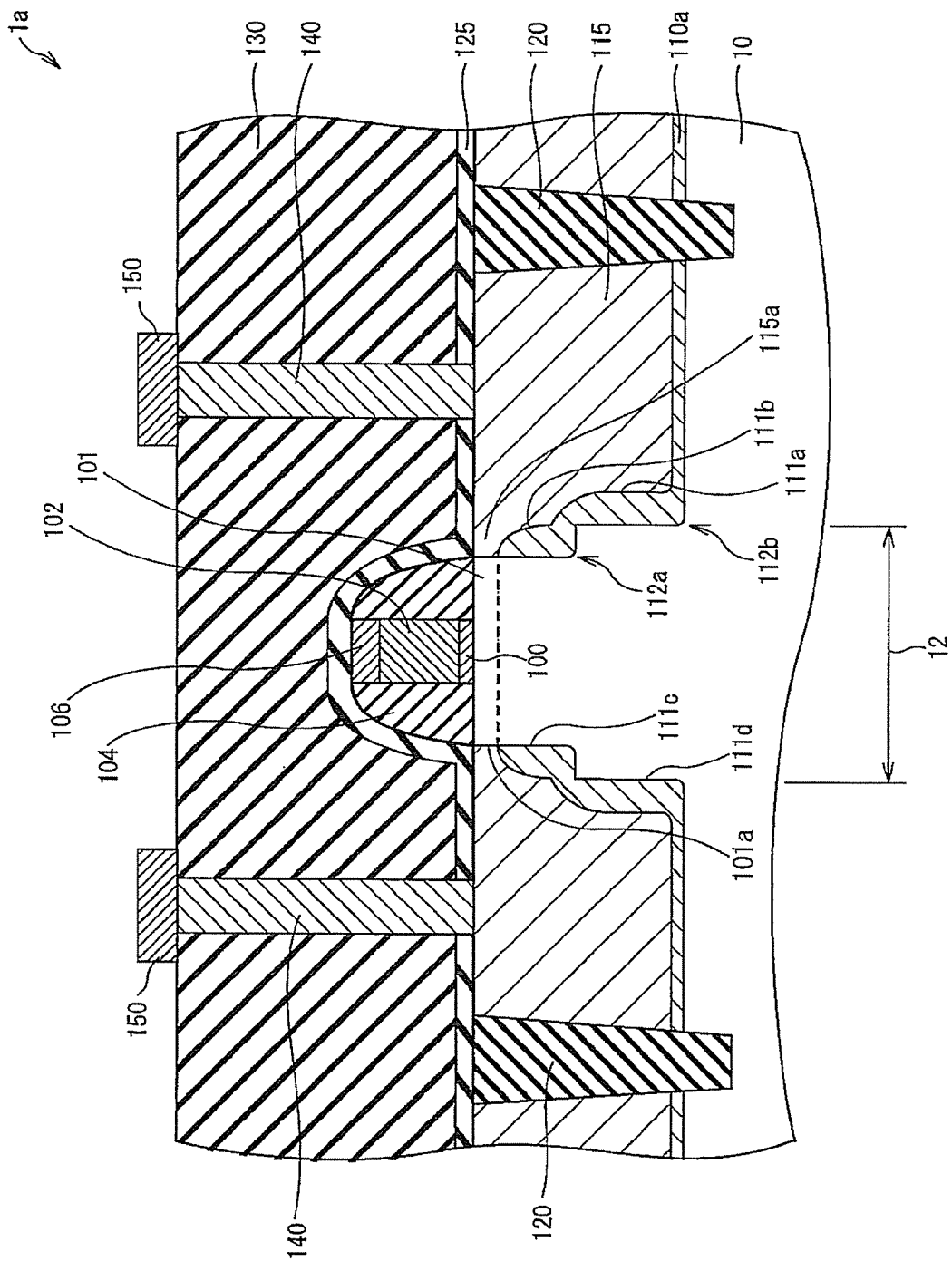
FIG. 7 is a partial cross sectional view showing a semiconductor device according to a second embodiment.

FIG. 7 is a partial cross section schematically showing a semiconductor device according to a second embodiment.

A semiconductor device 1a according to the second embodiment has the substantially same configuration as the semiconductor device 1, except that a shape of a halo layer 110a is different from the semiconductor device 1 according to the first embodiment. Therefore, detailed explanations will be omitted except for the difference.

The halo layer 110a according to the second embodiment is provided in contact with a side face of the convex region 12 other than the channel region 101 and the surface of semiconductor substrate 10. Therefore, in the second embodiment, the extension 115a is formed directly in contact with the side face of the channel region 101. Note that, the halo layer 110a is formed having a thickness such that a function for suppressing the short channel effect such as generation of a leak path, etc, is exerted.

The halo layer 110a has a boundary 111a formed in contact with the source/drain region 115 and a boundary 111b formed in contact with the extension 115a. In addition, the halo layer 110a has a boundary 111c formed in contact with the side face of the convex region 12 other than the side face of the convex region 12 in a portion corresponding to the channel region 101, and a boundary 111d formed in contact with the side face of the convex region 12 corresponding to the source/drain region 115 other than the extension 115a.

Figure 8:
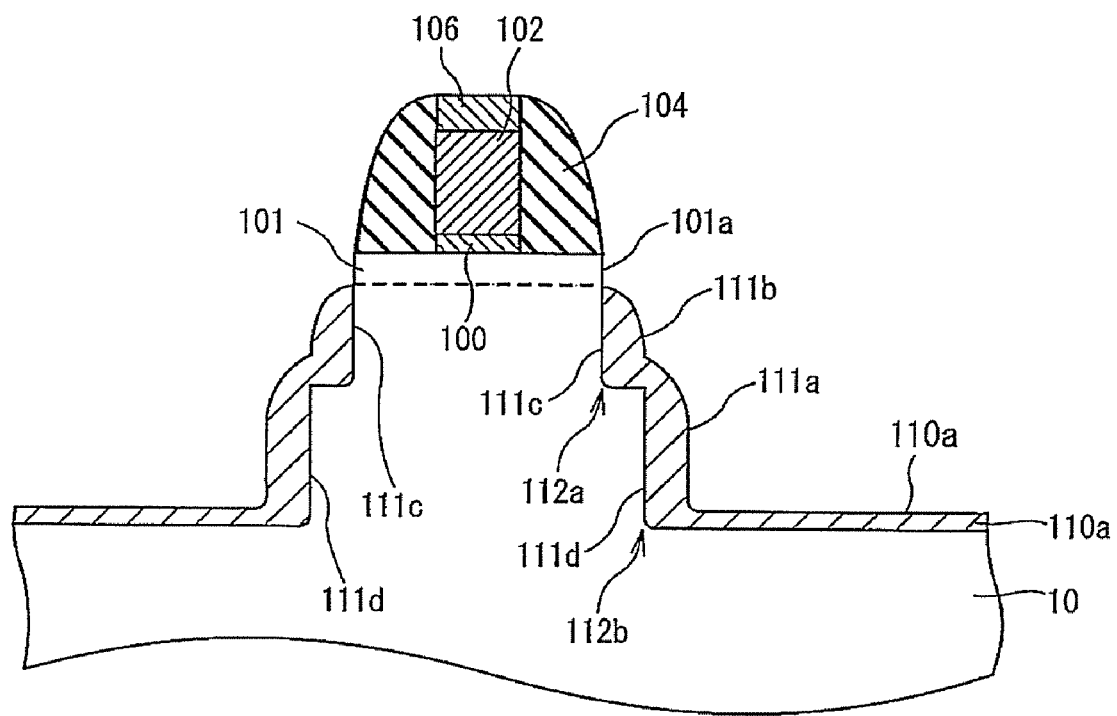
FIG. 8 is a partial cross sectional view showing a process for fabricating the semiconductor device according to the second embodiment.

FIG. 8 is a partial cross section schematically showing a semiconductor device according to the second embodiment in the middle of the fabrication process.

A method of fabricating the semiconductor device 1a according to the second embodiment provides the substantially same processes as the method of fabricating the semiconductor device 1 according to the first embodiment, except that an etching process is applied to an in situ epitaxially grown halo layer. Therefore, detailed explanations will be omitted except for the difference.

Firstly, similarly to the method of fabricating the semiconductor device 1 according to the first embodiment, a halo layer is formed by in situ epitaxial growth (for example, FIGS. 2A to 4B). Then, as shown in FIG. 8, a contact region 111a which is a region in contact with the extension 115a is exposed by applying a dry etching process to the formed halo layer. The exposed contact region 101a is a region which corresponds to a current pathway between the extension 115a and the channel region 101. Note that, when an etching amount of the halo layer by the dry etching process applied thereto is smaller than a thickness of the in situ epitaxially grown halo layer, the halo layer remains on the semiconductor substrate 10. Subsequently, the semiconductor device 1a according to the second embodiment can be fabricated through the same processes as the first embodiment.

In the semiconductor device 1a according to the second embodiment, since it is possible to suppress the short channel effect by the halo layer 110a as well as to directly contact the channel region 101 as a source/drain current path with the extensions 115a, it is possible to increase drive current.

Modification of the Second Embodiment

Figure 9:
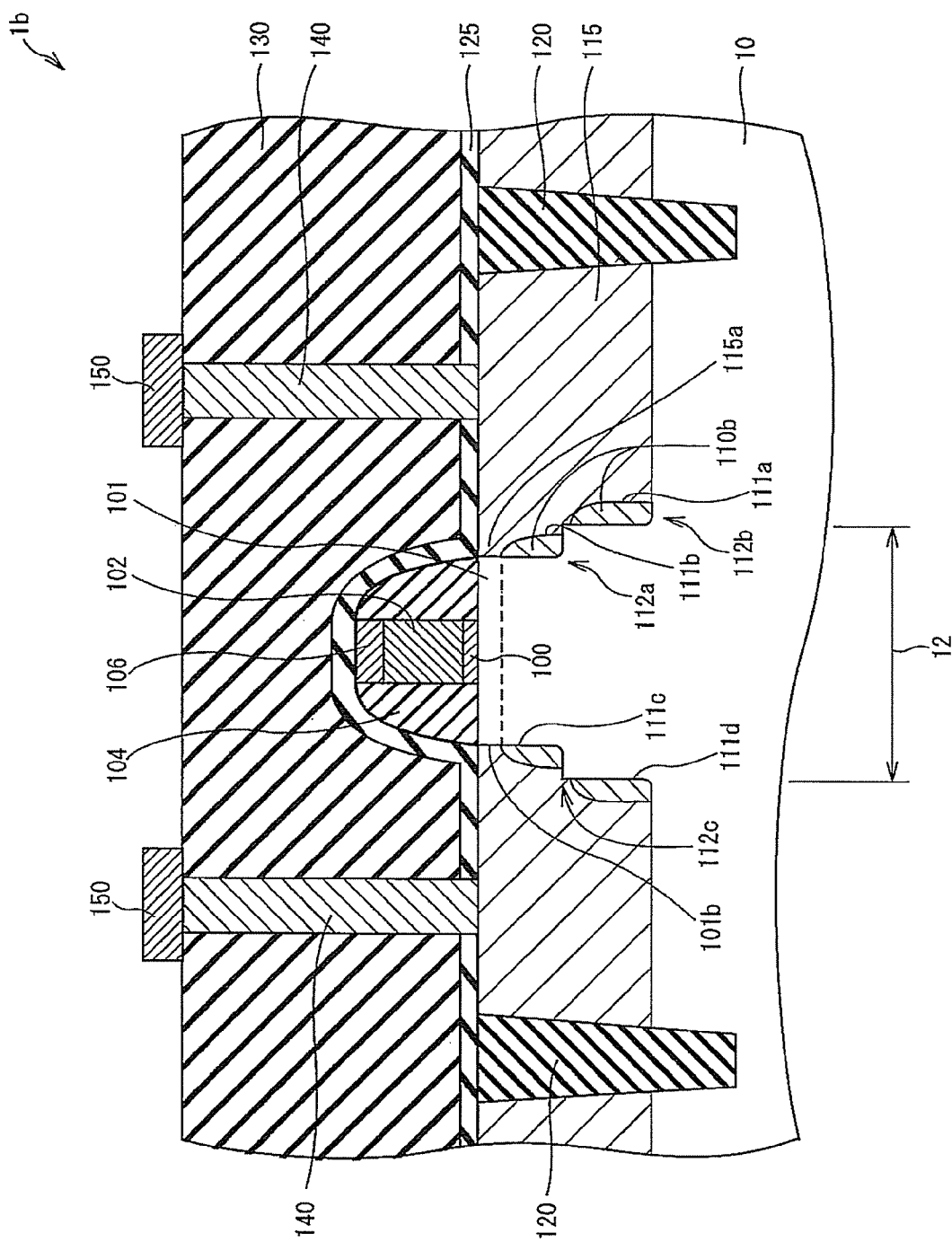
FIG. 9 is a partial cross sectional view showing a semiconductor device according to a modification of the second embodiment.

FIG. 9 is a partial cross section schematically showing a semiconductor device according to a modification of the second embodiment.

A semiconductor device 1b according to the modification of the second embodiment has the substantially same configuration as the semiconductor device 1a, except that a shape of a halo layer 110b is different from the semiconductor device 1a according to the second embodiment. Therefore, detailed explanations will be omitted except for the difference.

The halo layer 110b according to the modification of the second embodiment is provided in contact with portions 112a and 112b which can be a leak path, and the side face of the convex region 12 other than the channel region 101. In other words, unlike the halo layer 110a according to the second embodiment, the halo layer 110b is not provided on the surface of the semiconductor substrate 10 other than the vicinity of the convex region 12.

For example, the halo layer 110b is provided in contact with the side face of a portion of the convex region 12 corresponding to the extension 115a other than the side face of the channel region 101 in the convex region 12, and the side face of the convex region 12 corresponding to the source/drain region 115 other than the extension 115a. In other words, the halo layer 110b is provided on the side face of the convex region 12 other than the side face thereof corresponding to the channel region 101 and a portion of the convex region 12 which does not largely affect the leak path, e.g., an exposed portion 112c of the convex region 12 in which the convex region 12 contacts with the source/drain regions 115.

Figure 10:
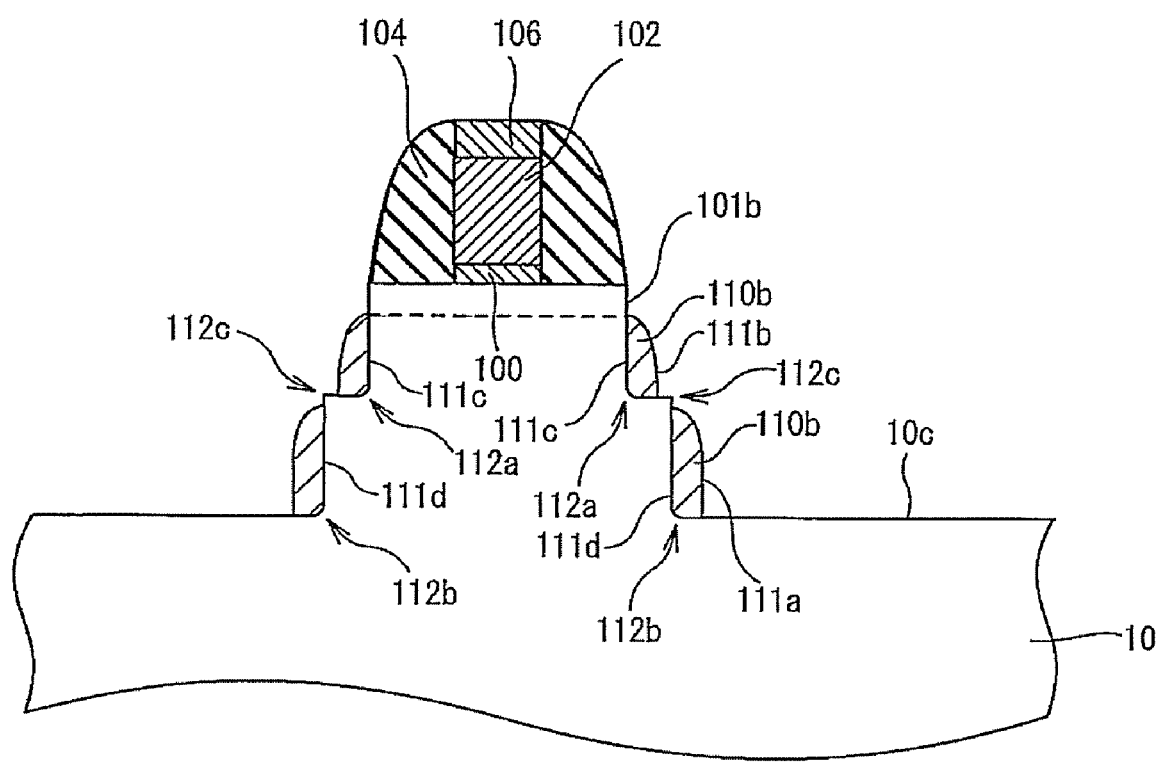
FIG. 10 is a partial cross sectional view showing a process for fabricating the semiconductor device according to the modification of the second embodiment.

FIG. 10 is a partial cross section schematically showing a semiconductor device according to the modification of the second embodiment in the middle of the fabrication process.

A method of fabricating the semiconductor device 1b according to the modification of the second embodiment provides the substantially same processes as the method of fabricating the semiconductor device 1a according to the second embodiment, except that etching amount in case of applying the etching process to the in situ epitaxially grown halo layer is different. Therefore, detailed explanations will be omitted except for the difference.

Firstly, similarly to the method of fabricating the semiconductor device 1 according to the first embodiment, a halo layer is formed by in situ epitaxial growth (for example, FIGS. 2A to 4B). Then, as shown in FIG. 10, the contact region 101b as a region in contact with the extension 115a is exposed by applying a dry etching process to the formed halo layer. In addition, the exposed portion 112c as a portion corresponding to a region in which the convex region 12 contacts with the source/drain region 115 is formed.

Here, the etching amount by the dry etching is set to an amount such that the halo layer formed on the surface 10c of the semiconductor substrate 10 other than the vicinity of the convex region 12 is removed. As a result, the halo layer formed on the semiconductor substrate 10 is removed and the surface 10c of the semiconductor substrate 10 is exposed. Subsequently, the semiconductor device 1b according to the modification of the second embodiment can be fabricated through the same processes as the first embodiment.

In the semiconductor device 1b according to the modification of the second embodiment, since the source/drain region 115 directly contacts with the semiconductor substrate 10, it is possible to decrease junction capacitance between the source/drain region 115 and the semiconductor substrate 10.

Third Embodiment

Figure 11:
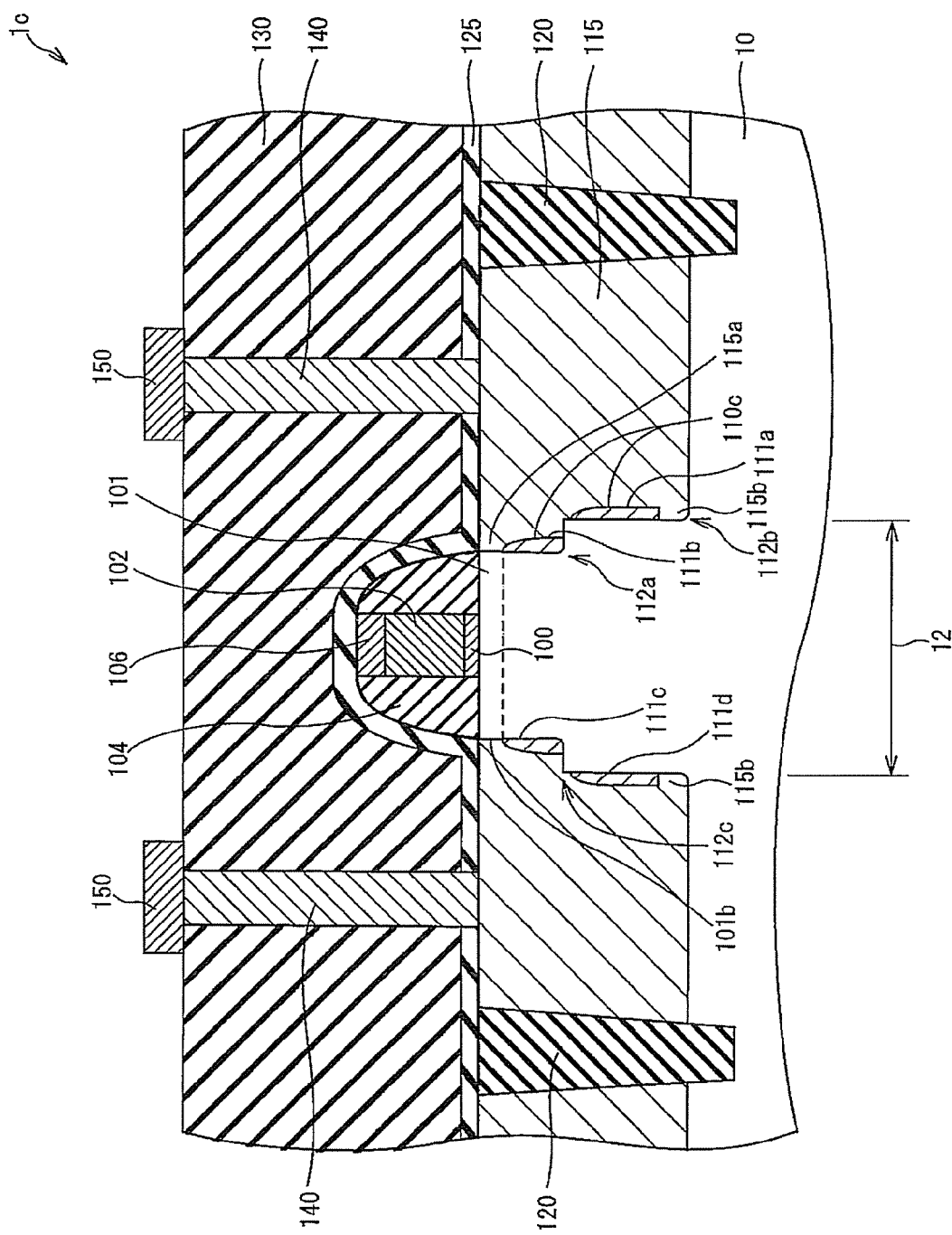
FIG. 11 is a partial cross sectional view showing a semiconductor device according to a third embodiment.

FIG. 11 is a partial cross section schematically showing a semiconductor device according to a third embodiment.

A semiconductor device 1c according to the third embodiment has the substantially same configuration as the semiconductor device 1b, except that a shape of a halo layer 110c is different from the semiconductor device 1b according to the second embodiment. Therefore, detailed explanations will be omitted except for the difference.

The semiconductor device 1c according to the third embodiment is provided in contact with the portions 112a and 112b which can be a leak path, and the side face of the convex region 12 other than the channel region 101. Furthermore, the halo layer 110c is formed at a distance from the surface of the semiconductor substrate 10. In other words, the source/drain region 115 is formed having a region 115b located between the halo layer 110c and the semiconductor substrate 10.

For example, the halo layer 110c is provided in contact with the side face of a portion of the convex region 12 corresponding to the extension 115a other than the side face of the channel region 101 in the convex region 12, and a portion of the side face of the convex region 12 corresponding to the source/drain region 115 other than the extension 115a. In other words, the halo layer 10c is formed, at a distance from the surface of the semiconductor substrate 10, on the side face of the convex region 12 other than the side face thereof corresponding to the channel region 101 and other than a portion of the convex region 12 which does not largely affect the leak path, e.g., an exposed portion 112c of the convex region 12 where the convex region 12 contacts with the source/drain region 115.

FIGS. 12A to 13B are partial cross sections schematically showing the semiconductor device according to the third embodiment in the middle of the fabrication process.

A method of fabricating the semiconductor device 1c according to the third embodiment provides the substantially same processes as the method of fabricating the semiconductor device 1 according to the first embodiment, except that the halo layer 110 is selectively epitaxially grown in a desired region. Therefore, detailed explanations will be omitted except for the difference.

Figure 12A:
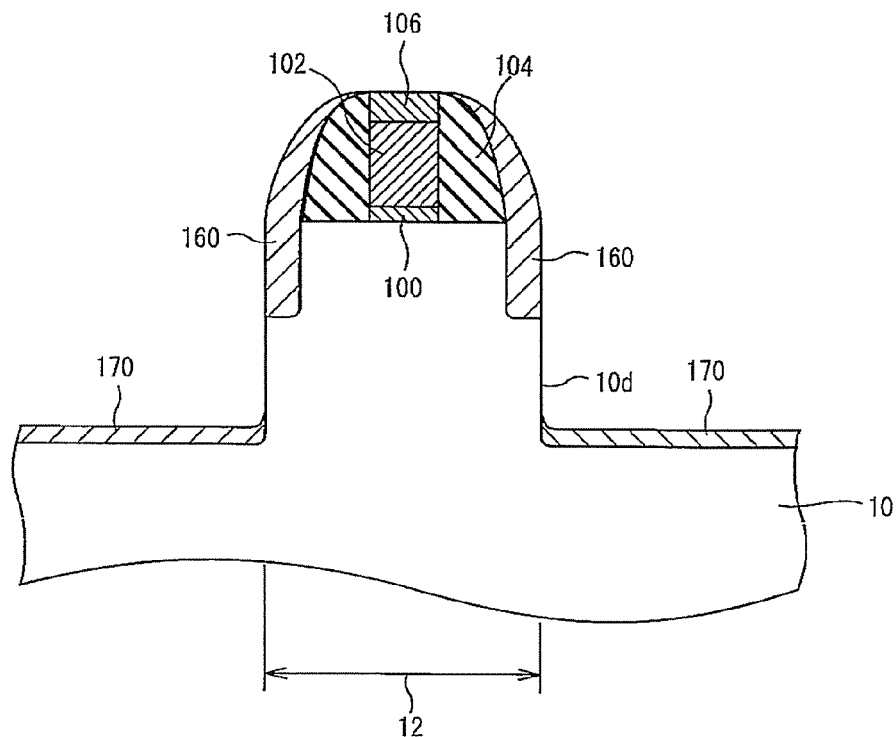
FIG. 12A is a partial cross sectional view showing a process for fabricating the semiconductor device according to the third embodiment.

Firstly, the semiconductor substrate 10, in which a spacer 160 is formed on side faces of a gate sidewall 104 and a portion of the convex region 12, is formed in the same way as the fabrication method of the first embodiment described in FIGS. 2A to 3B. Next, a predetermined ion as an epitaxial growth suppressing substance is implanted into the surface 10c of the semiconductor substrate 10. As a result, as shown in FIG. 12A, an ion implantation region 170 having a predetermined depth from the surface 10c of the semiconductor substrate 10 is formed. In the third embodiment, an ion which forms the ion implantation region 170 is, e.g., carbon (C). In addition, a C concentration of the ion implantation region 170 is set to, e.g., about $1 \times 10^{21}$ cm$^{-3}$.

Figure 12B:
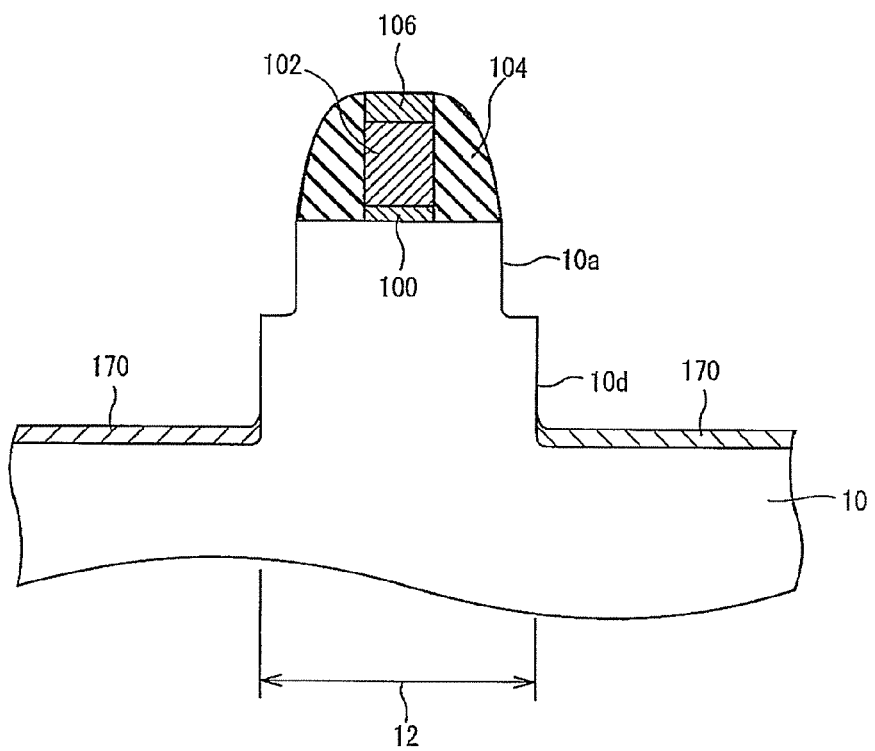
FIG. 12B is a partial cross sectional view showing a process for fabricating the semiconductor device according to the third embodiment.

Next, as shown in FIG. 12B, the spacer 160 is removed. As a result, the surfaces 10a and 10d of the convex region 12 as boundaries between the semiconductor substrate 10 and the subsequently formed halo layer 110 and between the convex region 12 and the subsequently formed halo layer 110 are formed. On the other hand, in the third embodiment, the surface of the semiconductor substrate 10 other than the convex region 12 is covered by the ion implantation region 170.

Figure 13A:
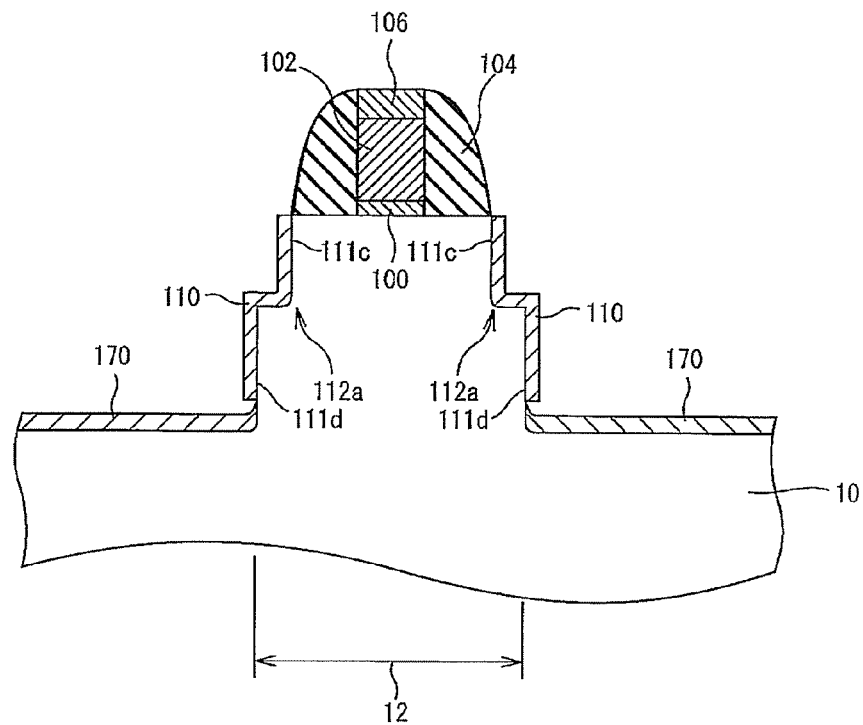
FIG. 13A is a partial cross sectional view showing a process for fabricating the semiconductor device according to the third embodiment.

Next, as shown in FIG. 13A, the halo layer 110 is epitaxially grown in situ on the side face of the convex region 12. When the halo layer 110 is made of Si, Si is not epitaxially grown on the ion implantation region 170. In other words, the halo layer 110 according to the present embodiment is selectively formed substantially only on the side face of the convex region 12. This is because, since a region being implanted with highly concentrated C functions as a region for suppressing the epitaxial growth, silicon is not epitaxially grown on the surface of the ion implantation region 170 of a silicon substrate as the semiconductor substrate 10.

Figure 13B:
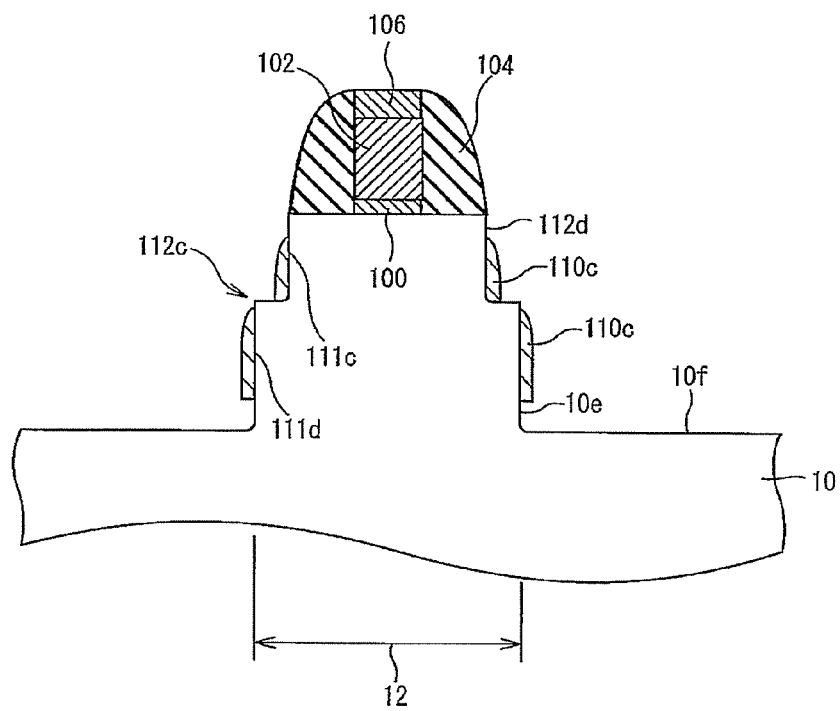
FIG. 13B is a partial cross sectional view showing a process for fabricating the semiconductor device according to the third embodiment.

Next, oxidation treatment is applied to the ion implantation region 170 for oxidizing the ion implantation region 170. Then, as shown in FIG. 13B, the oxidized ion implantation region 170 is removed by applying acid treatment to the oxidized ion implantation region 170. As a result, a surface 10f of the semiconductor substrate 10 and a surface 10e as a portion of the side face of the convex region 12 on which the surface 10c is not formed are exposed. In addition, the halo layer 110c, in which a portion of the halo layer 110 is also removed or etched and at least a side face 112d of the convex region 12 corresponding to the channel region 101 is exposed, is formed by the acid treatment. Note that, it is possible to use chemicals containing dilute hydrofluoric acid (DHF) or buffered hydrofluoric acid (BHF) for the acid treatment.

Following this, the semiconductor device 1c according to the third embodiment can be fabricated through the same processes as the first embodiment (for example, the processes corresponding to FIGS. 5A to 6).

In the semiconductor device 1c according to the third embodiment, it is possible to suppress the short channel effect by the halo layer 110c, and since the source/drain region 115 directly contacts with the semiconductor substrate 10, it is possible to suppress increase of junction capacitance between the source/drain region 115 and the semiconductor substrate 10. As a result, it is possible to improve an operating speed of the semiconductor device 1c.

Fourth Embodiment

Figure 14:
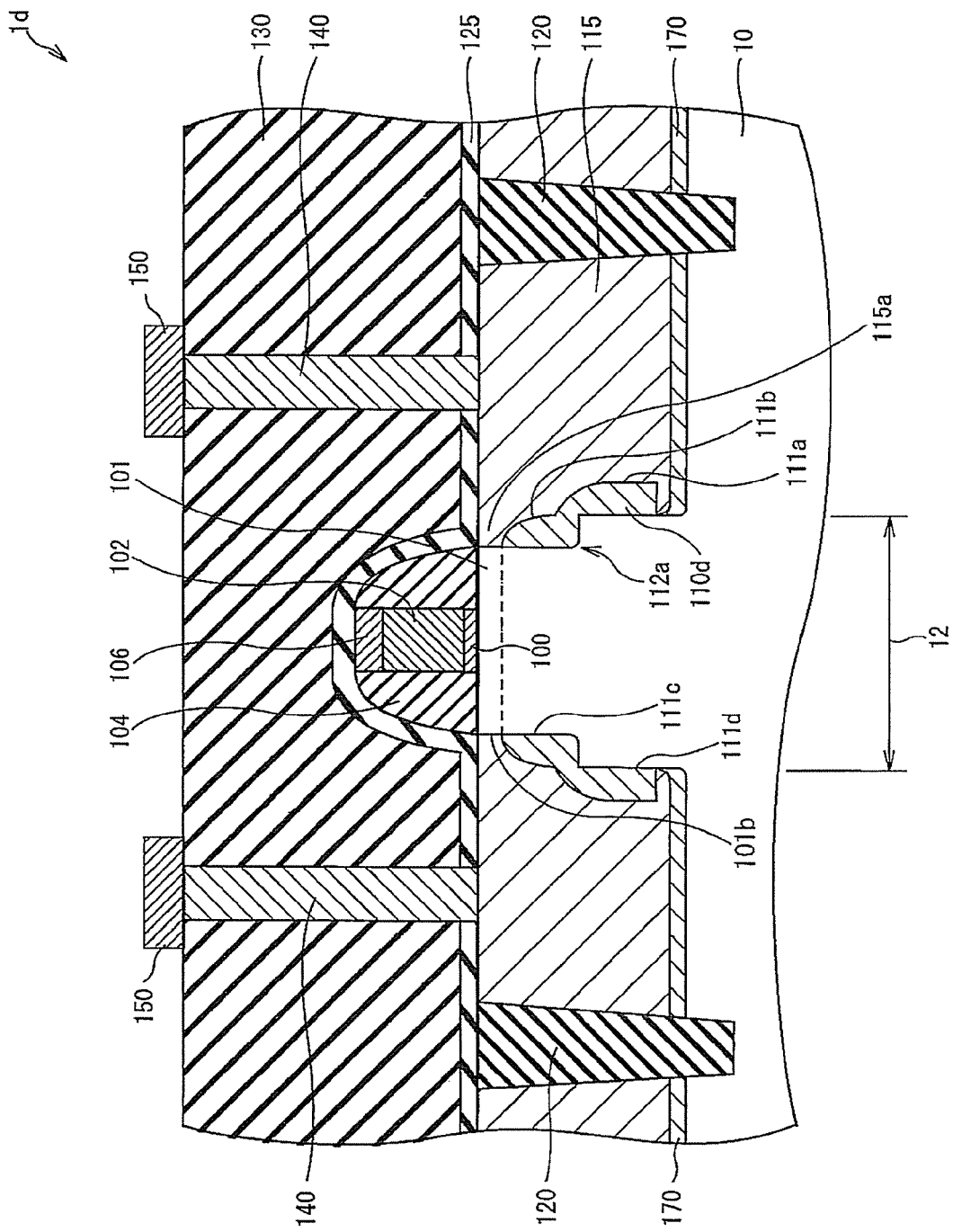
FIG. 14 is a partial cross sectional view showing a semiconductor device according to a fourth embodiment.

FIG. 14 is a partial cross section schematically showing a semiconductor device according to a fourth embodiment.

A semiconductor device 1d according to the fourth embodiment has the substantially same configuration as the semiconductor device 1c, except that, unlike the third embodiment, the ion implantation region 170 is provided. Therefore, detailed explanations will be omitted except for the difference.

The semiconductor device 1d according to the fourth embodiment is provided in contact with the portions 112a and 112b both of which can be a leak path, and the side face of the convex region 12 other than the channel region 101. Furthermore, a halo layer 110d is formed at a distance from the surface of the semiconductor substrate 10. In addition, the ion implantation region 170 is provided between the semiconductor substrate 10 and the source/drain region 115.

Figure 15:
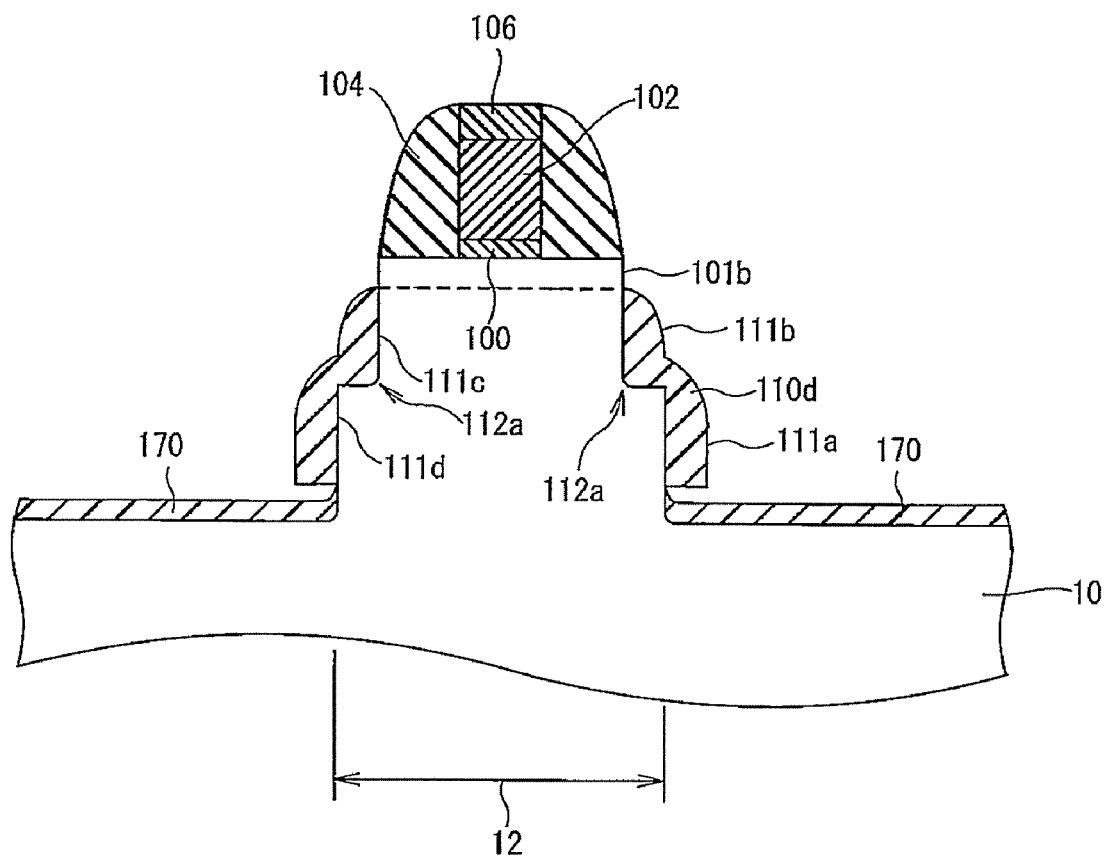
FIG. 15 is a partial cross sectional view showing a process for fabricating the semiconductor device according to the fourth embodiment.

FIG. 15 is a partial cross section schematically showing the semiconductor device according to the fourth embodiment in the middle of the fabrication process.

Firstly, the halo layer 110 is epitaxially grown in situ on the on the side face of the convex region 12 by the same processes as the third embodiment described in FIGS. 12A to 13A. Then, as shown in FIG. 15, an exposed portion to be a contact region 101b is formed on the side face of the convex region 12 corresponding to the channel region 101 by applying the dry etching process to the halo layer 110. The exposed portion will be a portion in which the extension 115a directly contacts with the channel region 101 when the semiconductor device 1d is completed. Following this, similarly to the first embodiment, the source/drain region 115 is epitaxially grown in situ without applying oxidation treatment to the ion implantation region 170.

In the method of fabricating the semiconductor device 1d according to the fourth embodiment, since the ion implantation region 170 formed on the surface of the semiconductor substrate 10 is not removed, it is possible to fabricate the semiconductor device 1d by simple processes while maintaining a thickness of the halo layer 110 to a predetermined thickness. Therefore, according to the fourth embodiment, it is possible to effectively suppress the short channel effect, to simplify the fabrication processes, to reduce the cost of production, and to improve a yield.

Fifth Embodiment

Figure 16:
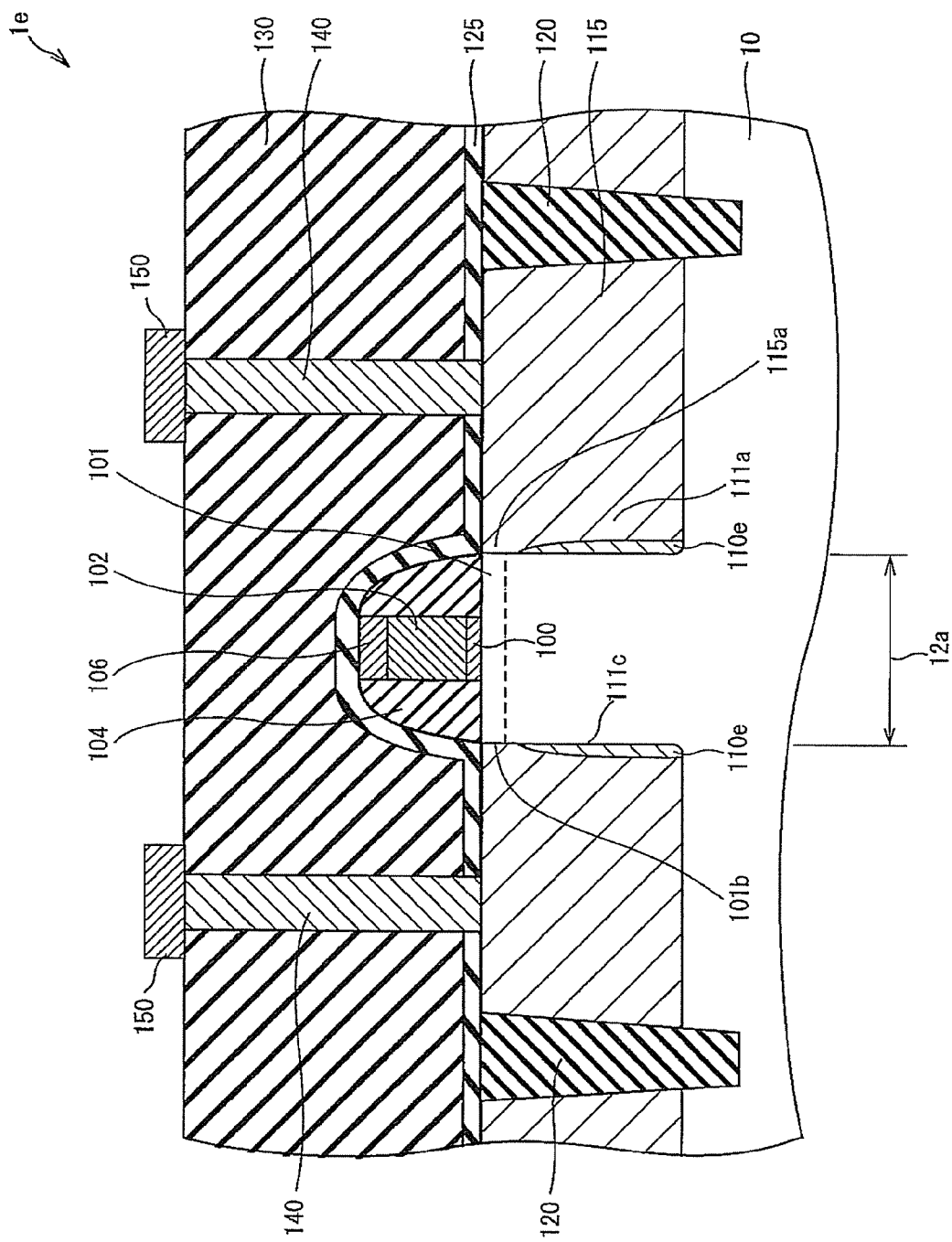
FIG. 16 is a partial cross sectional view showing a semiconductor device according to a fifth embodiment.

FIG. 16 shows a schematic is a partial cross section schematically showing a semiconductor device according to a fifth embodiment.

A semiconductor device 1e according to the fifth embodiment has the substantially same configuration as the semiconductor device 1c, except that the convex region 12 does not substantially have a level difference compared with the semiconductor device 1c according to the third embodiment. Therefore, detailed explanations will be omitted except for the difference.

The semiconductor device 1e according to the fifth embodiment includes a semiconductor substrate 10 having a convex region 12a in a predetermined region, a halo layer 110e provided in contact with a portion of a surface of the semiconductor substrate 10 and a predetermined region of a side face of the convex region 12a, and source/drain region 115 in contact with a surface of the halo layer 110e opposite to the surface in contact with the convex region 12a and having extension 115a.

The convex region 12a has the substantially same width from, e.g., an interface between the gate insulating film 100 and the upper end of the convex region 12a to the surface of the semiconductor substrate 10 (an interface between the source/drain region 115 and the semiconductor substrate 10). In other words, the convex region 12a is formed so that a width of a portion corresponding to the extension 115a is substantially same as that of a portion corresponding to the source/drain region 115. Namely, the convex region 12a according to the fifth embodiment is formed without having a level difference.

The halo layer 110e is provided between the side face of the convex region 12a and the source/drain region 115. Concretely, the halo layer 110e is provided in contact with the side face of the convex region 12a other than the side face of the channel region 101 in the convex region 12a. Then, a boundary 111c is formed at a portion where the halo layer 110e contacts with the side face of the convex region 12a, and a boundary 111a is formed at a portion where the halo layer 110e contacts with the source/drain region 115 and the extension 115a.

FIGS. 17A to 18B are partial cross sections schematically showing the semiconductor device according to the fifth embodiment in the middle of the fabrication process.

Firstly, element isolation regions 120 for each isolating regions, in which plural semiconductor devices 1e are formed, are formed in the semiconductor substrate 10. Following this, the gate electrode 102 is formed on a predetermined region of the semiconductor substrate 10. Then, the gate sidewalls 104 are formed on both side faces of the gate insulating film 100 and the gate electrode 102. Next, a cap layer 106 is formed on the gate electrode 102. Next, an etching process is applied to the semiconductor substrate 10 using the cap layer 106 and the gate sidewalls 104 as a mask. In the fifth embodiment, an etching depth of the semiconductor substrate 10 by the etching process is a depth greater than the thickness of the source/drain region 115 to be formed.

Figure 17A:
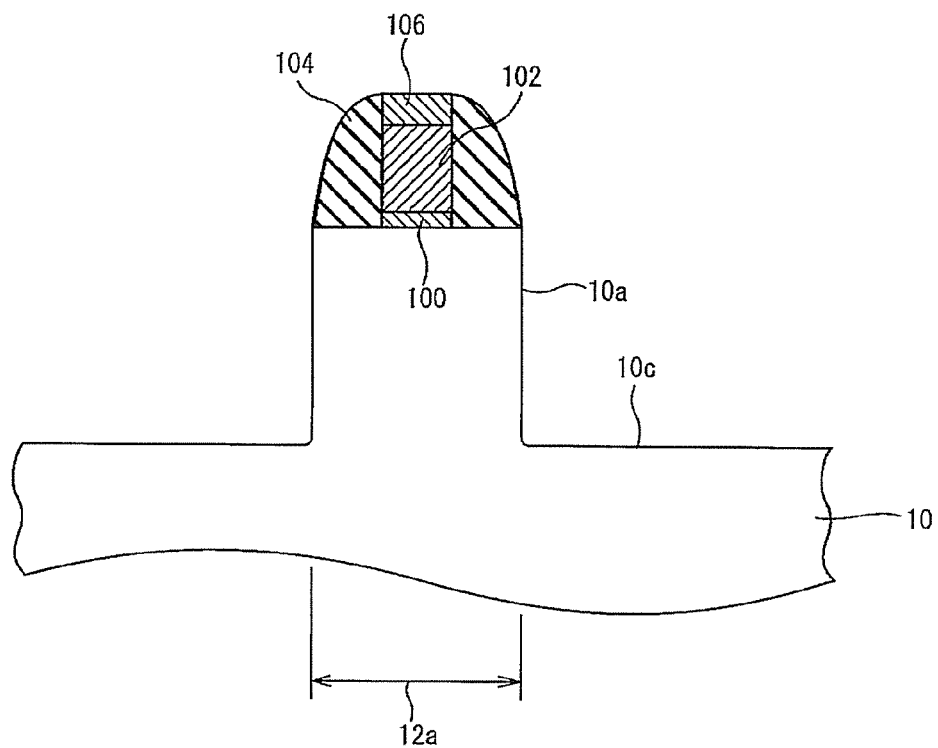
FIG. 17A is a partial cross sectional view showing a process for fabricating the semiconductor device according to the fifth embodiment.
Figure 17B:
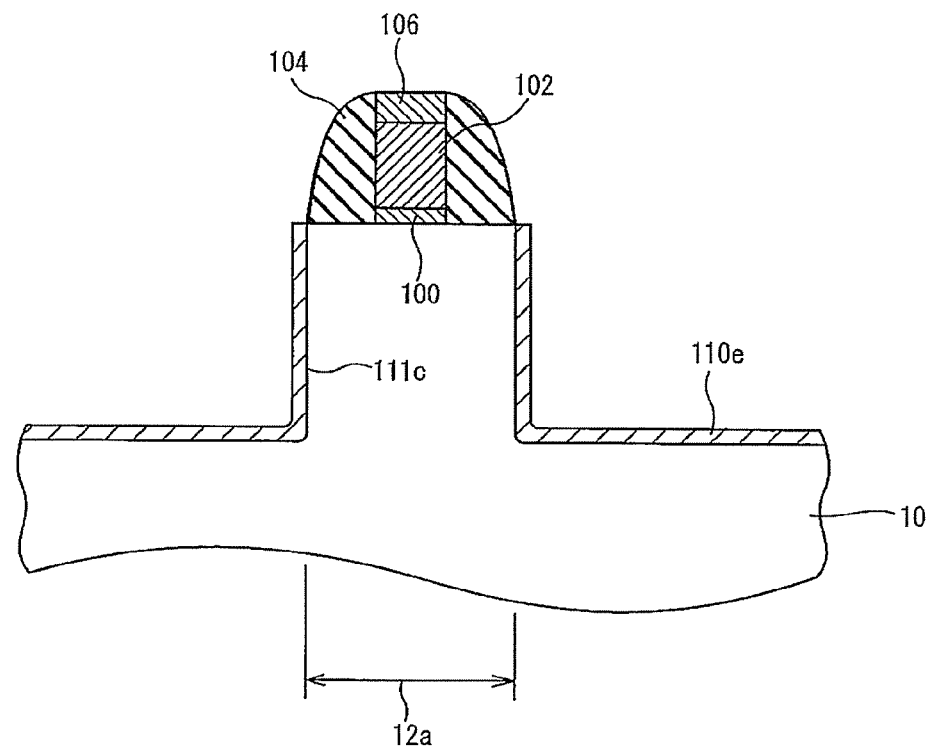
FIG. 17B is a partial cross sectional view showing a process for fabricating the semiconductor device according to the fifth embodiment.

As a result, as shown in FIG. 17A, the semiconductor substrate 10 other than a portion immediately under the cap layer 106 and the gate sidewall 104 is etched, the convex region 12a is thereby formed, and a surface 10c of the semiconductor substrate 10 and a surface 10a as the side face of the convex region 12a are exposed. Next, as shown in FIG. 17B, the halo layer 110e is epitaxially grown in situ on the surface of the semiconductor substrate 10 and the side faced of the convex region 12a.

Figure 18A:
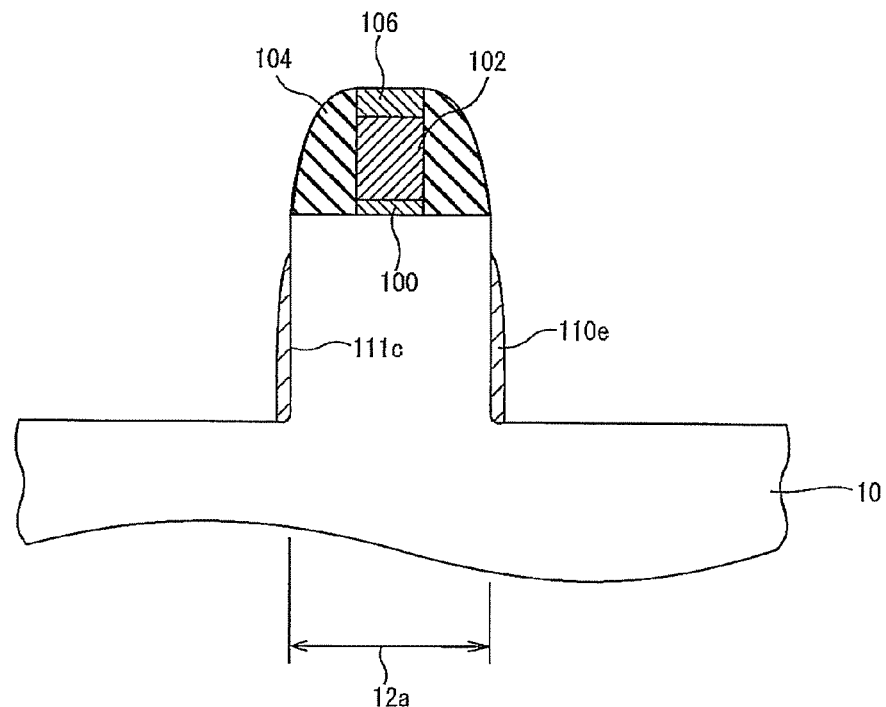
FIG. 18A is a partial cross sectional view showing a process for fabricating the semiconductor device according to the fifth embodiment.
Figure 18B:
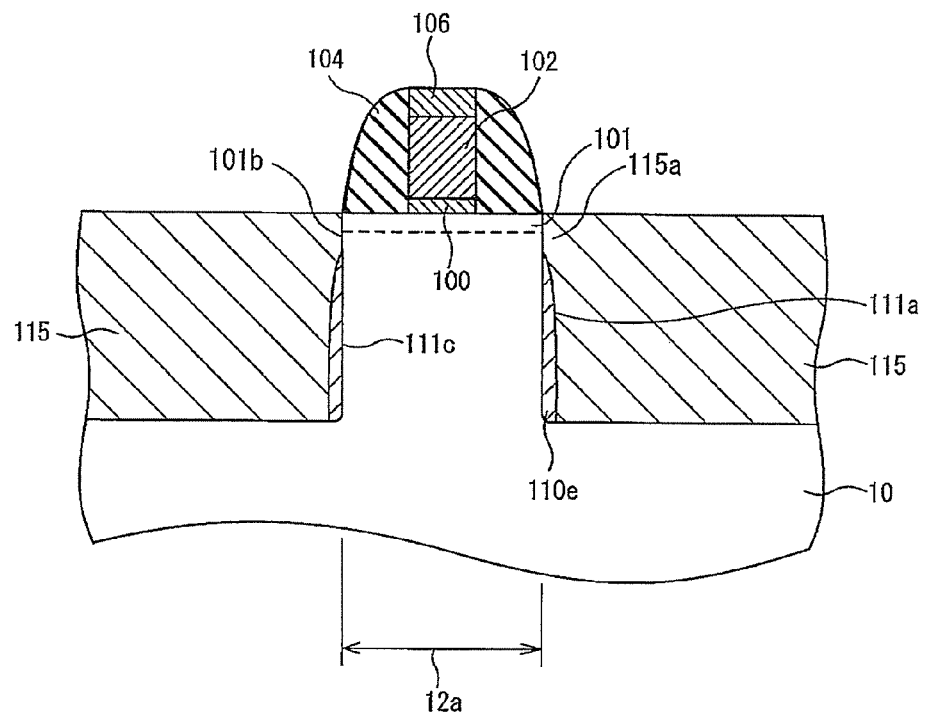
FIG. 18B is a partial cross sectional view showing a process for fabricating the semiconductor device according to the fifth embodiment.

Next, as shown in FIG. 18A, the side face of the channel region 101 in the convex region 12a is exposed by applying the etching process to the halo layer 110e. In addition, the halo layer 110e which is formed on the surface of the semiconductor substrate 10 other than the vicinity of the convex region 12a is also removed by the etching process. Following this, as shown in FIG. 18B, the source/drain region 115 having the extension 115a is formed on the semiconductor substrate 10 and the halo layer 110e by performing the in situ epitaxial growth of the source/drain region 115.

In the fifth embodiment, since the halo layer 110e is formed having a predetermined width, the source/drain region 115 having the extension 115a is automatically formed by in situ epitaxial growth of the source/drain region 115. Next, the semiconductor device 1e is fabricated by the same processes as the first embodiment.

In the method of fabricating the semiconductor device 1e according to the fifth embodiment, since the halo layer 110e having a predetermined thickness is formed on the side face of the convex region 12a other than a portion corresponding to the extension 115a and the in situ epitaxial growth of the source/drain region 115 is subsequently performed, the extension 115a is automatically formed in correspondence to the thickness of the halo layer 110e. As a result, in the fifth embodiment, it is possible to reduce the number of fabrication processes of the semiconductor device 1e, to decrease labor hours for the fabrication as well as the cost of production, and to improve a yield.

Modification of the Fifth Embodiment

Figure 19A:
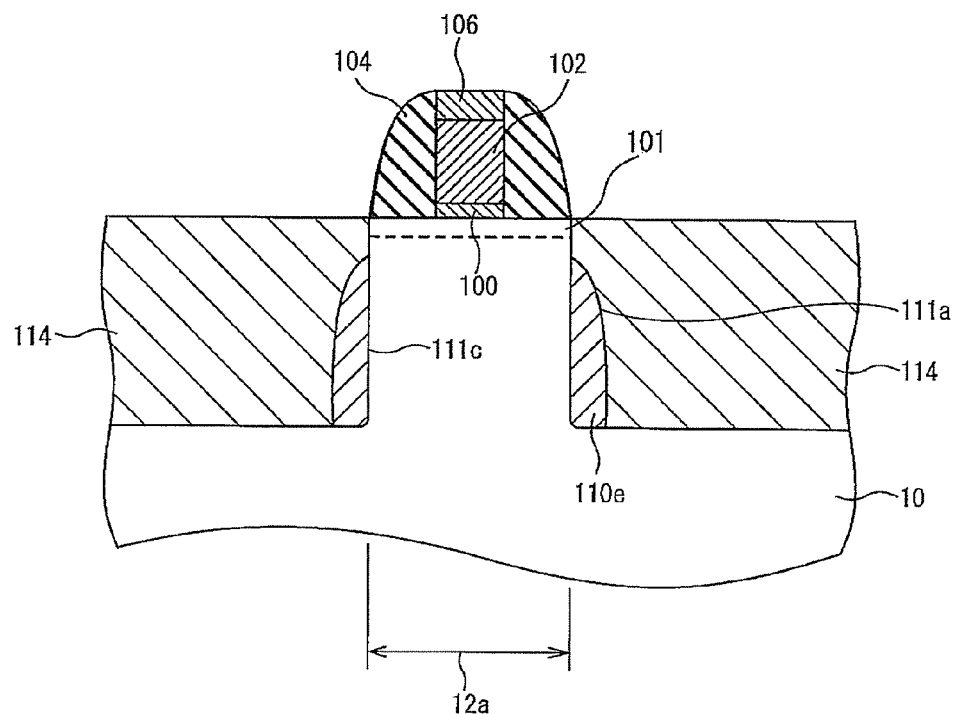
FIG. 19A is a partial cross sectional view showing a process for fabricating the semiconductor device according to a modification of the fifth embodiment.
Figure 19B:
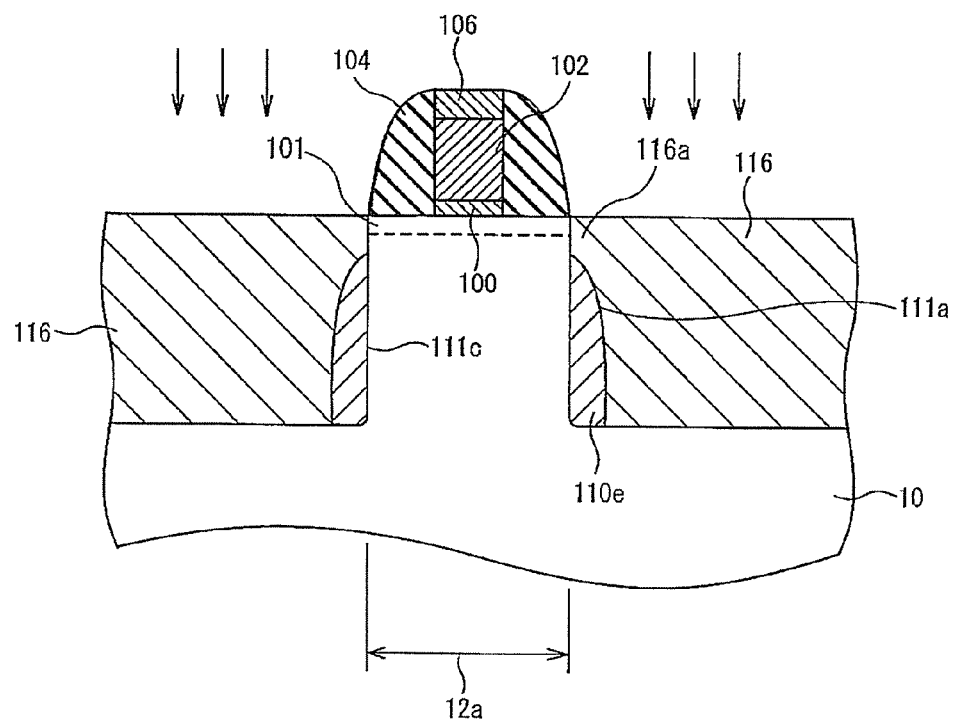
FIG. 19B is a partial cross sectional view showing a process for fabricating the semiconductor device according to the modification of the fifth embodiment.

FIGS. 19A and 19B are partial cross sections schematically showing the semiconductor device according to the fifth embodiment in the middle of the fabrication process.

A method of fabricating the semiconductor device according to the modification of the fifth embodiment provides the substantially same processes as the method of fabricating the semiconductor device 1e according to the fifth embodiment except a method of forming a source/drain region 116. Therefore, detailed explanations will be omitted except for the difference.

In the modification of the fifth embodiment, at first, a semiconductor material composing the source/drain region 116 is epitaxially grown on the semiconductor substrate 10 and the halo layer 110e. This epitaxial growth is performed without adding an impurity which should be diffused into the source/drain region 116. As a result, as shown in FIG. 19A, a growth layer 114 made of the semiconductor material composing the source/drain region 116 is formed on the semiconductor substrate 10 and the halo layer 110e. The growth layer 114 is made of, e.g., Si.

Next, as shown in FIG. 19B, a predetermined ion is implanted into the growth layer 114 by ion implantation, thereby forming the source/drain region 116 having an extension 116a. The ion implanted into the growth layer 114 is an n-type impurity ion such as A or P, etc., when a semiconductor device to be formed is n-type MOSFET. Meanwhile, when a semiconductor device to be formed is p-type MOSFET, the ion implanted into the growth layer 114 is a p-type impurity ion such as B or In, etc. Note that, in case that, after in situ epitaxial growth of the layer 114, the concentration of the impurity added to the growth layer 114 is not sufficient by this in situ epitaxial growth, it is possible to form the source/drain region 116 by further implanting a predetermined ion into the growth layer 114.

Sixth Embodiment

Figure 20:
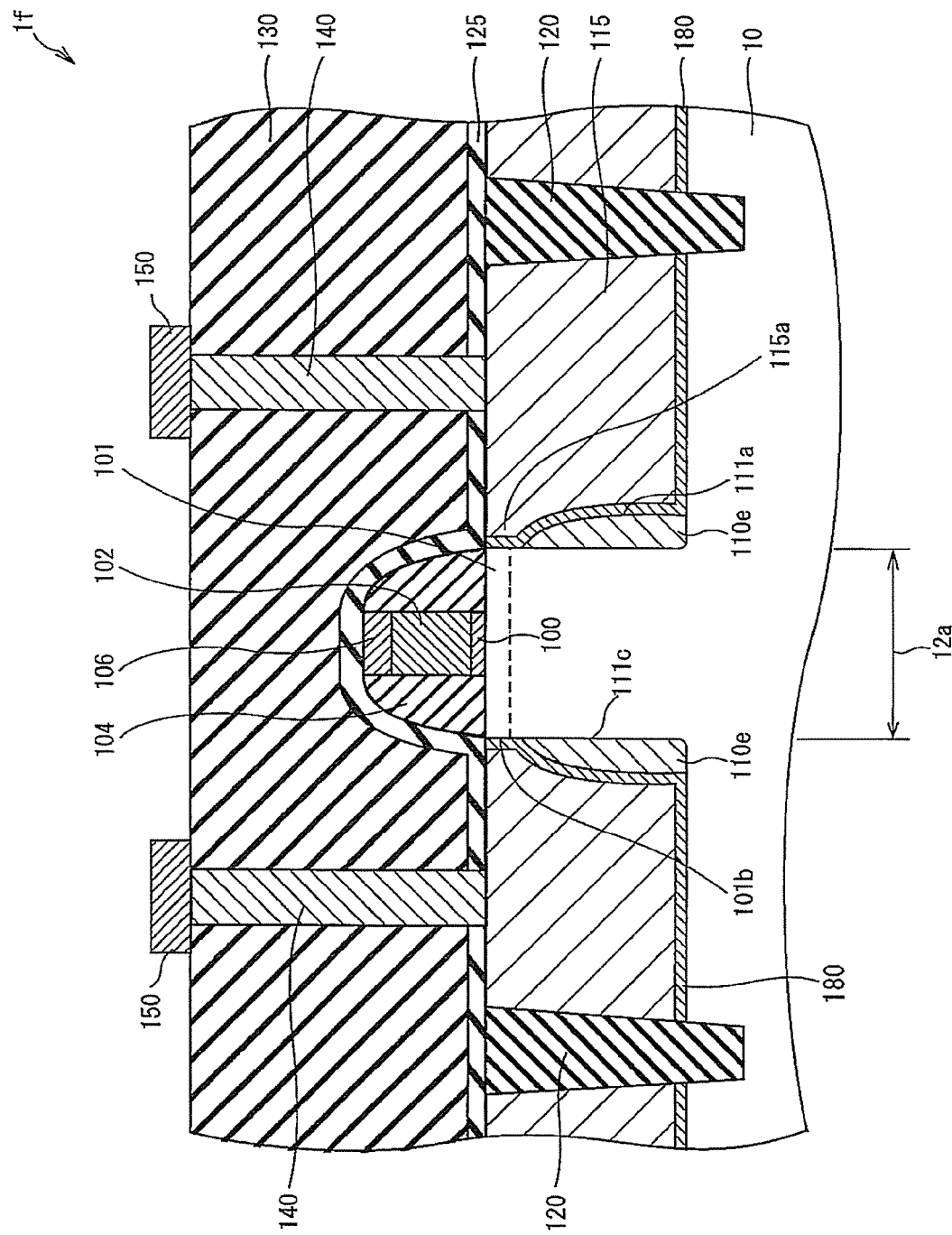
FIG. 20 is a partial cross sectional view showing a semiconductor device according to a sixth embodiment.

FIG. 20 is a partial cross section schematically showing a semiconductor device according to a sixth embodiment.

A semiconductor device 1f according to the sixth embodiment has the substantially same configuration as the semiconductor device 1e according to the fifth embodiment, except that a non-doped layer 180 is further provided between the halo layer 110e and the source/drain region 115. Therefore, detailed explanations will be omitted except for the difference.

The semiconductor device 1f according to the sixth embodiment includes a non-doped layer 180, in which no impurity is doped, between the halo layer 110e and the source/drain region 115. Concretely, the non-doped layer 180 is provided between the extension 115a and the side face of the channel region 101, between the halo layer 110e and the source/drain region 115 and between the semiconductor substrate 10 and the source/drain region 115. In the sixth embodiment, the halo layer 110e has respective boundaries between the side face of the convex region 12a and the halo layer 110e and between the halo layer 110e and the non-doped layer 180.

The non-doped layer 180 is made of, e.g., non impurity doped Si. Note that, even though the non-doped layer 180 is not doped with an impurity in the present embodiment, the impurity unavoidably mixed into the non-doped layer 180 is not eliminated. Alternatively, the non-doped layer 180 can be made of a semiconductor material such as SiGe, etc.

Figure 21A:
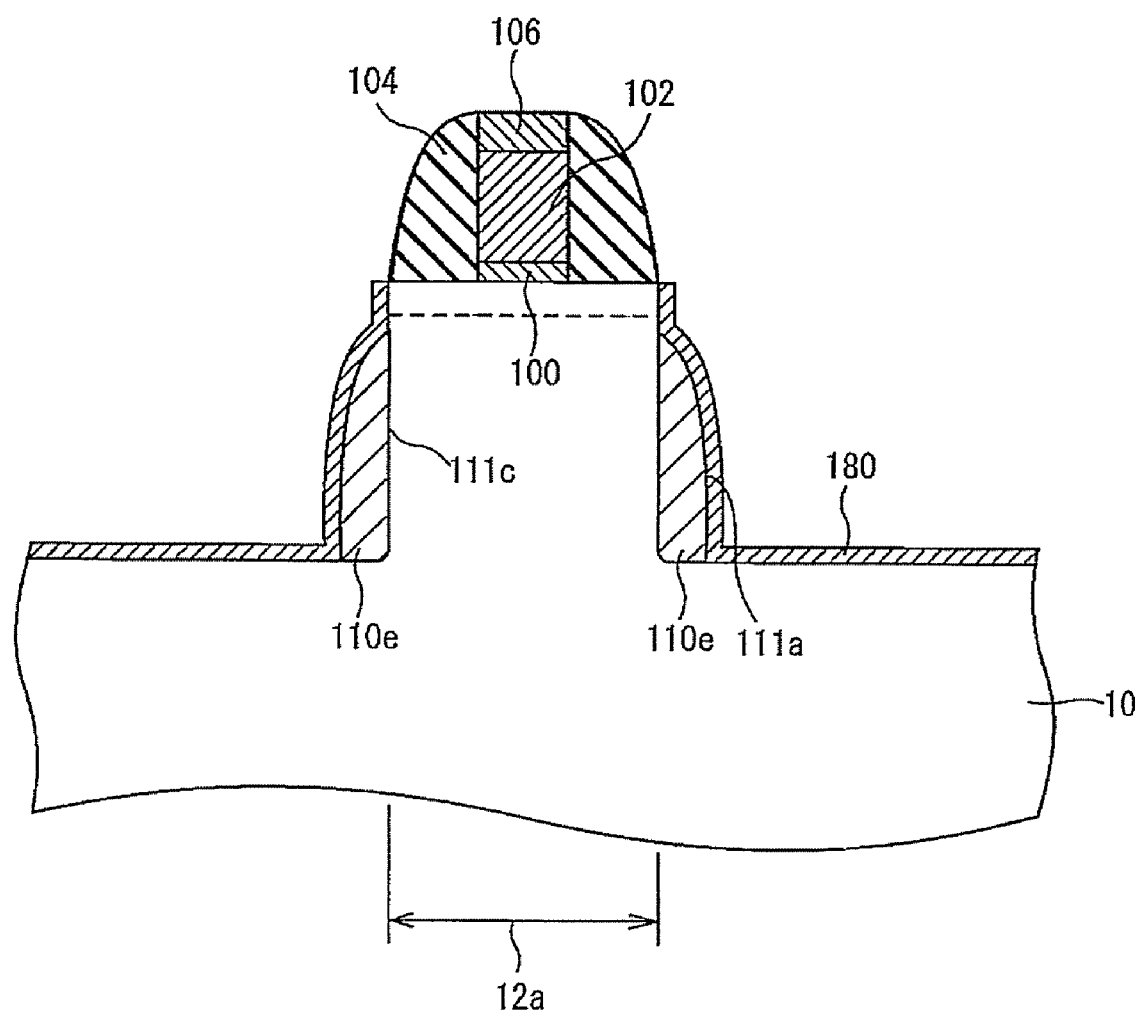
FIG. 21A is a partial cross sectional view showing a process for fabricating the semiconductor device according to the sixth embodiment.
Figure 21B:
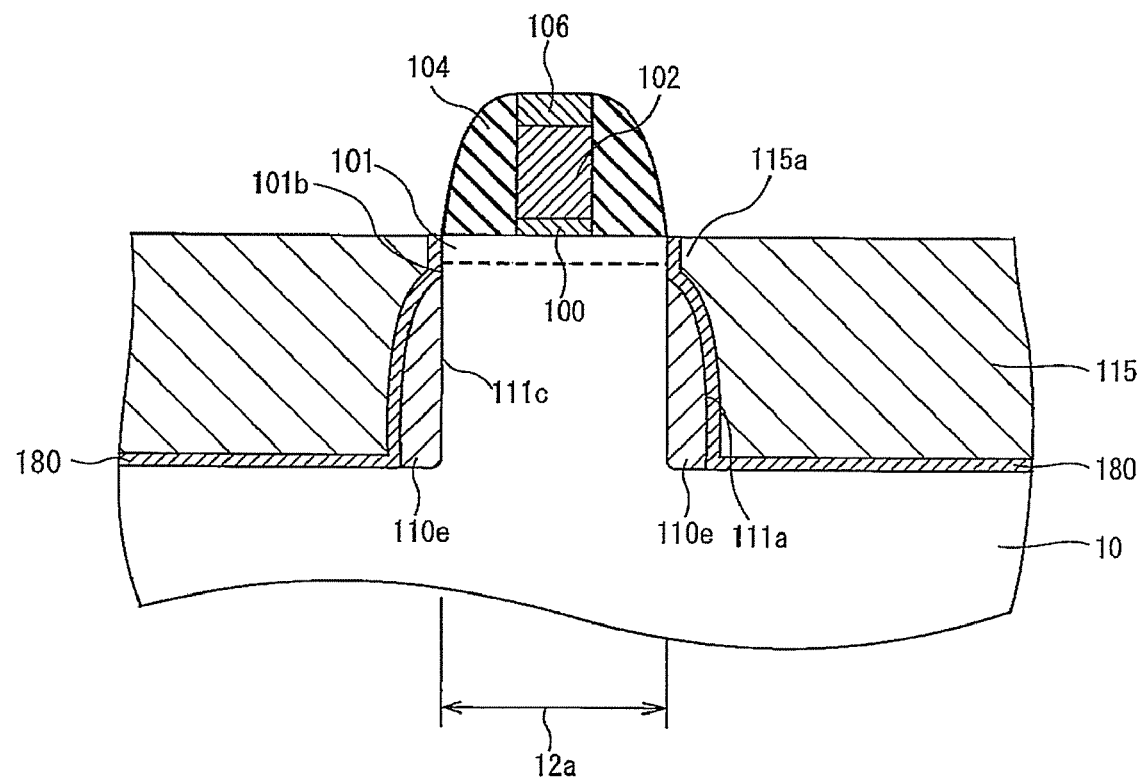
FIG. 21B is a partial cross sectional view showing a process for fabricating the semiconductor device according to the sixth embodiment.

FIGS. 21A and 21B are partial cross sections schematically showing the semiconductor device according to the sixth embodiment in the middle of the fabrication process.

A method of fabricating the semiconductor device 1f according to the sixth embodiment provides the substantially same processes as the method of fabricating the semiconductor device 1e according to the fifth embodiment, except that the non-doped layer 180 is further formed between the halo layer 110e and the source/drain region 115. Therefore, detailed explanations will be omitted except for the difference.

Firstly, as shown in FIG. 21A, the non-doped layer 180 having a predetermined thickness is epitaxially grown on the surface of the semiconductor substrate 10, the side face of the channel region 101 in the convex region 12a and the surface of the halo layer 110e. Next, as shown in FIG. 21B, the source/drain region 115 having the extension 115a is epitaxially grown in situ. Other processes are substantially same as the fifth embodiment.

Figure 22:
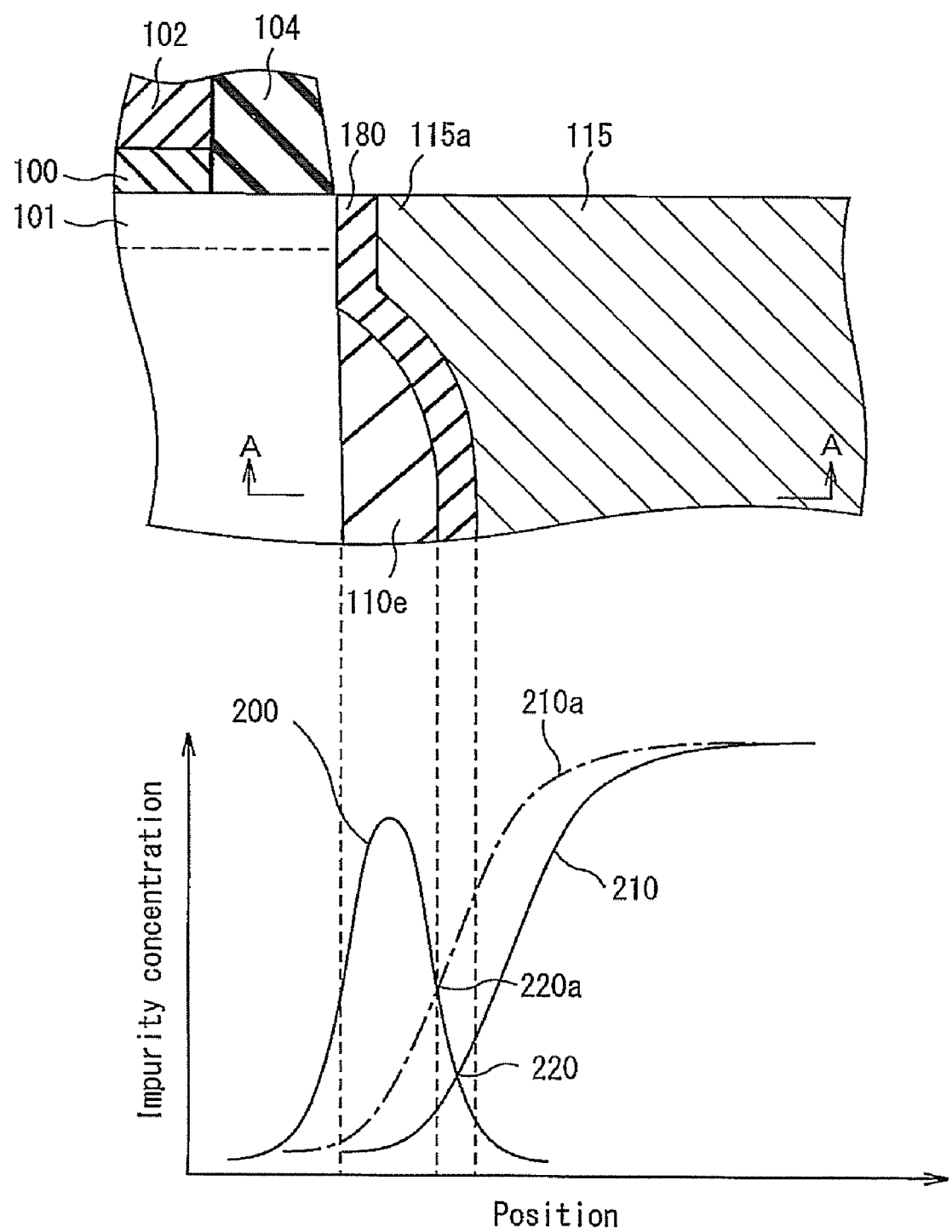
FIG. 22 is an explanatory diagram showing a function of a non-doped layer according to the sixth embodiment.

FIG. 22 is an explanatory diagram showing a function of a non-doped layer according to the sixth embodiment.

The graph of FIG. 22 shows impurity profiles of the halo layer 110e, the non-doped layer 180 and the source/drain region 115 taken at line A-A shown in FIG. 22.

In the semiconductor device 1f according to the sixth embodiment, the concentration of the impurity contained in the halo layer 110e (halo concentration 200) is concentrated in a region of the halo layer 110e as shown in the graph. Then, the halo concentration 200 steeply decreases across an interface between the halo layer 110e and the non-doped layer 180. Meanwhile, the concentration of the impurity contained in the source/drain region 115 (source/drain concentration 210) is concentrated in the source/drain region 115. Then, the source/drain concentration 210 gradually decreases from the source/drain region 115 toward the non-doped layer 180 side. Note that, an impurity concentration at a portion where the profile of the halo concentration 200 crosses that of the source/drain concentration 210 is defined as a batting concentration 220.

In the semiconductor device 1f according to the sixth embodiment, if the non-doped layer 180 does not exist, the profile of the source/drain concentration moves to the halo layer 110e side by the thickness of the non-doped layer 180 (source/drain concentration 210a). Thus, a batting concentration 220a in case of not having the non-doped layer 180 becomes higher than the batting concentration 220 in case of having the non-doped layer 180.

The semiconductor device 1f according to the sixth embodiment includes the non-doped layer 180 having a predetermined thickness between the halo layer 110e and the source/drain region 115, and the non-doped layer 180 has a function for reducing the batting concentration 220.

Since the semiconductor device 1f according to the sixth embodiment includes the non-doped layer 180 between the halo layer 110e and the source/drain region 115, it is possible to reduce the batting concentration 220, and to expand a deletion layer which is formed between the halo layer 110e and the source/drain region 115. As a result, it is possible to reduce junction capacitance between the halo layer 110e and the source/drain region 115, thus, it is possible to operate the semiconductor device 1f at high speed.

In addition, the non-doped layer 180 can reduce the batting concentration, thereby reducing the junction leak between the halo layer 110e and the source/drain region 115.

Note that, the halo layer according to the first to sixth embodiments and the modifications thereof has an impurity profile such that the impurity concentration of the halo layer changes steeply at a boundary between the halo layer and the convex region, that between the halo layer and the extension and that between the halo layer and the source/drain region, however, this steep impurity profile does not eliminate the existence of the impurity unavoidably diffused from the halo layer across the boundaries.

Although the embodiments have been described, the above-mentioned embodiments do not limit the invention according to the scope of claims. In addition, all combinations of characteristics explained in the embodiments are not necessarily essential for solving the problem of the present invention.

What is claimed is:

1. A semiconductor device, comprising:
   a semiconductor substrate;
   a convex region provided in the semiconductor substrate; a gate insulating film provided on the convex region;
   a channel region located in the convex region under the gate insulating film;
   source/drain regions provided on both sides of the convex region and having extensions on both sides of the channel region; and
   a halo layer provided between the convex region and the source/drain region so as to contact with the convex region, wherein
   boundaries are provided between the halo layer and the source/drain region and between the halo region and the convex region and impurity concentration is steeply changed at the boundaries.

2. The semiconductor device according to claim 1, wherein the convex region has different widths in a portion corresponding to the extension and in a portion other than the portion corresponding to the extension.

3. The semiconductor device according to claim 2, wherein the convex region is formed so that the width of the portion corresponding to the extension is narrower than that of the portion other than the portion corresponding to the extension.

4. The semiconductor device according to claim 1, further comprising: a gate electrode provided on the gate insulating film, wherein the halo layer is formed so as to be located on the side face side of the convex region.

5. The semiconductor device according to claim 1, wherein the convex region has an inclined surface or a curved surface inclining with respect to the surface of the semiconductor substrate.

* * * * *